(12) United States Patent
Lim et al.

(10) Patent No.: US 11,521,570 B2
(45) Date of Patent: Dec. 6, 2022

(54) GATE DRIVER AND DISPLAY DEVICE INCLUDING THE SAME

(71) Applicant: Samsung Display Co., Ltd., Yongin-si (KR)

(72) Inventors: Sung Hoon Lim, Yongin-si (KR); Kang Nam Kim, Yongin-si (KR); Seok Hwan Bang, Yongin-si (KR); Sung Hwan Won, Yongin-si (KR); Woo Geun Lee, Yongin-si (KR); Kyu Sik Cho, Yongin-si (KR); Soo Jung Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 350 days.

(21) Appl. No.: 16/809,452

(22) Filed: Mar. 4, 2020

(65) Prior Publication Data
US 2020/0394978 A1    Dec. 17, 2020

(30) Foreign Application Priority Data

Jun. 14, 2019    (KR) ........................ 10-2019-0071021

(51) Int. Cl.
*G09G 3/36*    (2006.01)

(52) U.S. Cl.
CPC ......... *G09G 3/3688* (2013.01); *G09G 3/3677* (2013.01); *G09G 3/3696* (2013.01); *G09G 2310/08* (2013.01)

(58) Field of Classification Search
CPC .. G09G 3/3688; G09G 3/3677; G09G 3/3696; G09G 2310/08
See application file for complete search history.

(56) References Cited

U.S. PATENT DOCUMENTS

| | | | |
|---|---|---|---|
| 9,318,616 B2 | 4/2016 | Hong et al. |
| 9,379,249 B2 | 6/2016 | Ji et al. |
| 9,559,210 B2 | 1/2017 | Oh et al. |
| 9,589,988 B2 | 3/2017 | Yamazaki et al. |
| 9,768,310 B2 | 9/2017 | Ahn et al. |
| 9,991,287 B2 | 6/2018 | Lim et al. |

(Continued)

FOREIGN PATENT DOCUMENTS

| | | |
|---|---|---|
| KR | 10-2016-0062831 | 6/2016 |
| KR | 10-2016-0086497 | 7/2016 |

(Continued)

*Primary Examiner* — Temesghen Ghebretinsae
*Assistant Examiner* — Sosina Abebe
(74) *Attorney, Agent, or Firm* — H.C. Park & Associates, PLC

(57) ABSTRACT

A gate driver for a display device includes: a clock signal line to transfer a clock signal; and a plurality of stages to sequentially output a gate signal based upon the clock signal in response to a carry signal. The plurality of stages include a plurality of thin film transistors, and at least one of the plurality of thin film transistors includes a thin film transistor including an oxide semiconductor. The at least one thin film transistor includes a first gate electrode and a second gate electrode disposed in different layers, the oxide semiconductor is disposed between the first gate electrode and the second gate electrode, and the first gate electrode and the second gate electrode are connected to receive a common voltage signal.

17 Claims, 9 Drawing Sheets

(56) References Cited

U.S. PATENT DOCUMENTS

| | | | |
|---|---|---|---|
| 2010/0012940 A1* | 1/2010 | Sato | H01L 27/1251 438/22 |
| 2012/0146978 A1* | 6/2012 | Park | G11C 19/287 377/64 |
| 2014/0055444 A1* | 2/2014 | Jang | G09G 3/3266 345/213 |
| 2015/0206500 A1* | 7/2015 | Kim | H03K 17/165 345/215 |
| 2016/0035303 A1* | 2/2016 | Kim | H01L 29/78648 345/206 |
| 2016/0204136 A1 | 7/2016 | Takeuchi et al. | |
| 2017/0032733 A1* | 2/2017 | Jang | H01L 29/78633 |
| 2018/0166585 A1* | 6/2018 | Takechi | G09G 3/20 |
| 2018/0337682 A1* | 11/2018 | Takasugi | H03K 21/18 |
| 2018/0366066 A1* | 12/2018 | Kim | H01L 27/3265 |
| 2020/0243018 A1 | 7/2020 | Kim et al. | |

FOREIGN PATENT DOCUMENTS

| | | |
|---|---|---|
| KR | 10-2017-0126535 | 11/2017 |
| KR | 10-2020-0094895 | 8/2020 |

\* cited by examiner

GATE DRIVER AND DISPLAY DEVICE INCLUDING THE SAME

CROSS-REFERENCE TO RELATED APPLICATION

This application claims priority from and the benefit of Korean Patent Application No. 10-2019-0071021, filed on Jun. 14, 2019, which is hereby incorporated by reference for all purposes as if fully set forth herein.

BACKGROUND

Field

Exemplary implementations of the invention generally relates to a driver circuit and a display device including the same and, more specifically, to a gate driver to supply signals to display pixels and a display device including the same.

Discussion of the Background

With the development of multimedia, the importance of display devices is increasing. Accordingly, various display devices such as a liquid crystal display device (LCD) and an organic light emitting display device (OLED) have been developed.

A display device includes a display and a driver. The display includes scan lines, data lines, and pixels. The driver includes a scan driver configured to sequentially provide a scan signal to the scan lines and a data driver configured to provide a data signal to the data lines. Each of the pixels emits light with a luminance corresponding to a data signal provided through a corresponding data line in response to a scan signal provided through a corresponding scan line.

The above information disclosed in this Background section is only for understanding of the background of the inventive concepts, and, therefore, it may contain information that does not constitute prior art.

SUMMARY

Applicant discovered that when the voltage level of an input signal to a thin film transistor in a gate driver of a display device is supplied at a high voltage level, degradation of the electrical characteristics of the thin film transistor may deteriorate over time.

Gate drivers and display devices constructed according to the principles and exemplary implementations of the invention are capable of preventing or at least reducing degradation of the electrical characteristics of transistors in the gate driver. For example, a gate driver may include a thin film transistor having a synchronous gate electrode structure that enables substantially constant flow of current through the thin film transistor to be maintained without degradation even when a clock signal having a high voltage level, such as 36 V or higher, is applied.

Further, a thin film transistor having a synchronous gate electrode structure constructed according to the principles and exemplary embodiments of the invention improves the mobility characteristics of the thin film transistor. Accordingly, the size of the thin film transistor can be decreased, and a narrow bezel of the display device can be effectively implemented.

Additional features of the inventive concepts will be set forth in the description which follows, and in part will be apparent from the description, or may be learned by practice of the inventive concepts.

According to one aspect of the invention, a gate driver for a display device includes: a clock signal line to transfer a clock signal; and a plurality of stages to sequentially output a gate signal based upon the clock signal in response to a carry signal, wherein the plurality of stages include a plurality of thin film transistors, wherein at least one of the plurality of thin film transistors includes a thin film transistor including an oxide semiconductor, wherein the at least one thin film transistor includes a first gate electrode and a second gate electrode disposed in different layers, wherein the oxide semiconductor is disposed between the first gate electrode and the second gate electrode, and wherein the first gate electrode and the second gate electrode are connected to receive a common voltage signal.

The first gate electrode and the second gate electrode may contact and be electrically connected to each other.

The clock signal may include a first clock signal and a second clock signal, the first clock signal may have a pulse waveform, and the second clock signal may be a signal obtained by shifting the first clock signal by a half period of the first clock signal.

The at least one thin film transistor may include: a transistor input terminal connected to a first electrode to receive an input signal; and a transistor output terminal connected to a second electrode to output an output signal, and the first electrode may be any one of a source electrode and a drain electrode, and the second electrode may be the other of the source electrode and the drain electrode.

The input signal applied to the transistor input terminal may have a voltage of about 36 V or higher, and the at least one thin film transistor may have a current maintenance ratio of about 90% or more.

The transistor input terminal may be directly connected to the clock signal line, and receive any one of the first clock signal and the second clock signal from the clock signal line.

The transistor output terminal may be directly connected to a gate line, and output the gate signal through the gate line.

The plurality of stages may be sequentially connected to each other through carry signal lines, and the transistor input terminal may be directly connected to one of the carry signal lines to receive the carry signal of a previous stage from the one of the carry signal lines.

According to another aspect of the invention, a gate driver for a display device includes: a clock signal line configured to transfer a clock signal; and a plurality of stages to sequentially output a gate signal based upon the clock signal in response to a carry signal, wherein the plurality of stages include a plurality of thin film transistors, wherein at least one of the plurality of thin film transistors includes: a substrate; a first electrode layer disposed on the substrate; a buffer layer disposed over the first electrode layer; an active layer disposed on the buffer layer, the active layer including an oxide semiconductor; a second electrode layer disposed on the active layer; a first protective layer covering the active layer, the first protective layer including a first contact hole exposing a first region of the active layer and a second contact hole exposing a second region of the active layer; a third electrode layer disposed on the first protective layer, the third electrode layer being connected to the first region through the first contact hole; and a fourth electrode layer disposed on the first protective layer, the fourth electrode layer being connected to the second region through the second contact hole, and wherein the second electrode layer is directly connected to the first electrode layer through a third contact hole formed in the buffer layer.

The at least one thin film transistor may include: a transistor input terminal connected to the third electrode layer to receive an input signal; and a transistor output terminal connected to the fourth electrode layer to output an output signal, and the third electrode layer may be any one of a source electrode and a drain electrode, and the fourth electrode layer may be the other of the source electrode and the drain electrode.

The input signal applied to the transistor input terminal may have a voltage of about 36 V or higher, and the at least one thin film transistor may have a current maintenance ratio of about 90% or more.

The transistor input terminal may be directly connected to the clock signal line to receive the clock signal from the clock signal line.

The plurality of stages may be sequentially connected to each other through carry signal lines, and the transistor input terminal may be directly connected to one of the carry signal lines to receive the carry signal of a previous stage from the one of the carry signal lines.

According to still another aspect of the invention, a display device includes: a display panel having a display region and a peripheral region; a display disposed on the display panel in the display region, the display including a plurality of pixels respectively connected to gate lines and data lines; a gate driver disposed on the display panel in the peripheral region to supply a gate signal to the gate lines; and a data driver to supply a data signal to the data lines, wherein the gate driver includes: a clock signal line to transfer a clock signal; and a plurality of stages to sequentially output a gate signal, based on the clock signal, wherein a pth (p is a natural number of 2 or more) stage of the plurality of stages is configured to output the gate signal to one of the gate lines based on the clock signal in response to a (p−1)th carry signal of a (p−1)th stage of the plurality of stages, wherein the pth stage includes a thin film transistor including an oxide semiconductor, wherein the thin film transistor includes a first gate electrode and a second gate electrode disposed in different layers, wherein the oxide semiconductor is disposed between the first gate electrode and the second gate electrode, and wherein the first gate electrode and the second gate electrode are connected to commonly receive a voltage signal.

The gate signal may include a scan signal and a sensing signal, and each of the gate lines may include a scan line and a sensing line, the scan signal may be supplied to the plurality of pixels through the scan lines of the gate lines, and the sensing signal may be supplied to the plurality of pixels through the sensing lines of the gate lines.

Each of the plurality of pixels may include: a light emitting device; a driving transistor to determine a magnitude of current flowing through the light emitting device; a switching transistor connected to a gate electrode of the driving transistor; and a sensing transistor connected to an anode electrode of the light emitting device, and one of the scan lines may be connected to a gate electrode of the switching transistor, one of the sensing lines may be connected to a gate electrode of the sensing transistor, and one of the data lines may be connected one electrode of the switching transistor.

Each of the plurality of pixels may include a first display plate, a second display plate facing the first display plate, and a liquid crystal layer disposed between the first display plate and the second display plate, the first display plate may include a pixel electrode and a switching element connected to the pixel electrode, one of the gate lines, and one of the data lines, and the second display plate may include a common electrode.

The thin film transistor may include a drain electrode and a source electrode, and one of the drain electrode and the source electrode may be electrically connected to the clock signal line to receive the clock signal, and the other one of the drain electrode and the source electrode may be electrically connected to the one of the gate lines to output the gate signal in response to the voltage signal.

The plurality of stages may be sequentially connected to each other through carry signal lines, the at least one thin film transistor may include a drain electrode and a source electrode, and one of the drain electrode and the source electrode may be electrically connected to one of the carry signal lines to receive the (p−1)th carry signal, and the other one of the drain electrode and the source electrode may be configured to output an output signal in response to the voltage signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
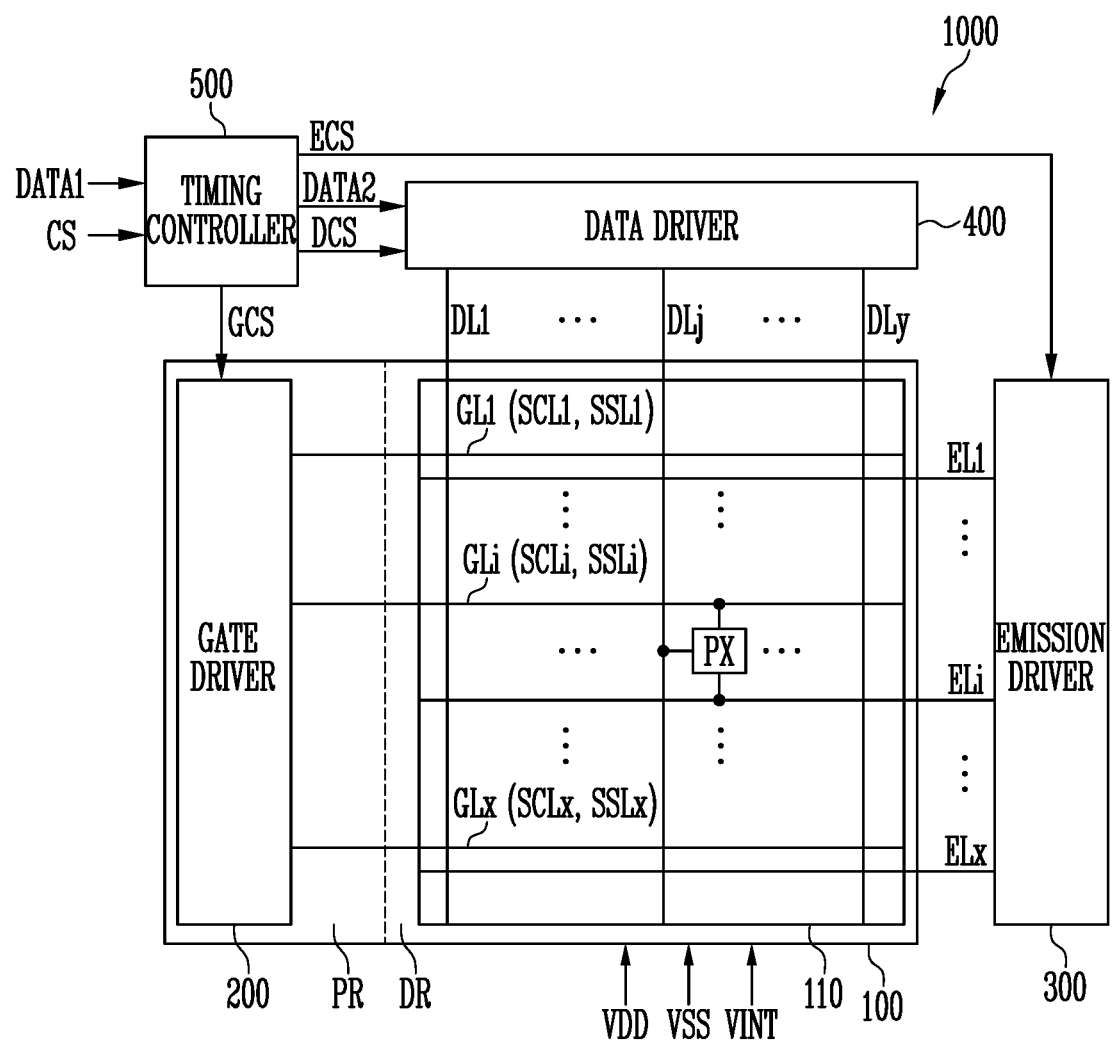
FIG. 1 is a block diagram schematically illustrating a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram schematically illustrating a display device constructed according to the principles of the invention.

Referring to FIG. 1, the display device 1000 may include a display 110, a gate driver 200, an emission driver 300, a data driver 400, and a timing controller 500. In exemplary embodiments, the emission driver 300 may be omitted.

The display 110 and the gate driver 200 may be disposed on a display panel 100. The display panel 100 may be divided into a display region DR including the display 110 that displays an image and a peripheral region PR that is adjacent to the display region DR and has the gate driver 200 disposed therein.

The display 110 may include a plurality of gate lines GL1 to GLx (x is an integer greater than 0), a plurality of emission control lines EL1 to ELx, a plurality of data lines DL1 to DLy (y is an integer greater than 0), and a plurality of pixels PX.

The plurality of gate lines GL1 to GLx may be any one of scan lines SCL1 to SCLx for transferring scan signals and sensing lines SSL1 to SSLx for transferring sensing signals. In exemplary embodiments, the gate lines GL1 to GLx may include both the scan lines SCL1 to SCLx and the sensing lines SSL1 to SSLx.

The pixels PX may be arranged in the display 110, and be disposed in regions defined by the gate lines GL1 to GLx, the emission control lines EL1 to ELx, and the data lines DL1 to DLy.

Each of the pixels PX may include a display element (or light emitting device) that emits colored light. For example, the display element may be a liquid crystal display element, an organic light emitting display element, or an inorganic light emitting display element. Hereinafter, a case where the display element is an organic light emitting display element is assumed for convenience in description. However, exemplary embodiments are not limited thereto. For example, the display element may be a liquid crystal display element, one example of which will be described later with reference to FIG. 9.

The plurality of pixels PX may be arranged in a matrix form having a plurality of rows and a plurality of columns on the display 110. Each pixel PX may be connected to at least one of the gate lines GL1 to GLx, at least one of the emission control lines EL1 to ELx, and one of the data lines DL1 to DLy.

A first power supply line VDD, a second power supply line VSS, and a third power supply line VINT may be provided to the display 110. Voltages necessary for an operation of the pixel PX may be applied to the power supply lines VDD, VSS, and VINT, and a voltage applied to the first power supply line VDD may have a voltage level higher than that of a voltage applied to the second power supply line VSS. The third power supply line VINT may be a line for supplying an initialization voltage.

The gate driver 200 may receive a gate driving control signal GCS from the timing controller 500. The gate driving control signal GCS may include a start signal and clock signals, which will be described later. In addition, a fourth power source and a fifth power source, which are necessary for an operation of the gate driver 200, may be further provided to the gate driver 200. For example, the fourth power source may be a voltage having a logic high level, and the fifth power source may be a voltage having a logic low level.

The gate driver 200 may generate a gate signal, and sequentially provide the gate signal to the gate lines GL1 to GLx. The gate driver 200 may include shift registers (or stages) each configured to sequentially generate and output a gate signal in a pulse form, which corresponds to the start signal, by using a clock signal of the gate driving control signal GCS. The gate signal in the pulse form, which is generated by the gate driver 200, may be applied to each pixel PX through the gate lines GL1 to GLx.

The emission driver 300 may receive an emission driving control signal ECS from the timing controller 500. The emission driver 300 may generate an emission control signal, based on the emission driving control signal ECS, and sequentially or simultaneously provide the emission control signal to the emission control lines EL1 to ELx. The emission driving control signal ECS may include an emission start signal, emission clock signals, and the like. The emission driver 300 may include shift registers each configured to sequentially generate and output an emission control signal in a pulse form, which corresponds to the emission start signal in the pulse form, by using the emission clock signals. As described above, in exemplary embodiments, the emission driver 300 may be omitted.

The data driver 400 may generate data signals, based on image data DATA2 and a data control signal DCS, which are provided from the timing controller 500, and provide the data signals to the display 110 (or the pixels PX). The data control signal DCS is a signal for controlling an operation of the data driver 400, and include a load signal (or data enable signal) instructing the output of a valid data signal, and the like. Each pixel PX may receive a data signal through a corresponding data line among the data lines DL1 to DLy, and emit light with a luminance corresponding to the data signal.

The timing controller 500 may receive input image data DATA1 and a control signal CS from the outside (e.g., a graphic processor), generate a gate driving control signal GCS and the data control signal DCS, based on the control signal CS, and generate the image data DATA2 by converting the input image data DATA1. For example, the timing controller 500 may convert the input image data DATA1 in an RGB format into the image data DATA2 in the RGB format, which corresponds to an arrangement of the pixels PXL disposed in the display 110.

The gate driver 200 may be formed on the display panel 100, and be disposed in the peripheral region PR. At least one of the emission driver 300, the data driver 400, and the timing controller 500 may be formed on the display panel 100, or be implemented with an Integrated Circuit (IC) to be connected to the display panel 100 in the form of a Tape Carrier Package (TCP).

Figure 2:
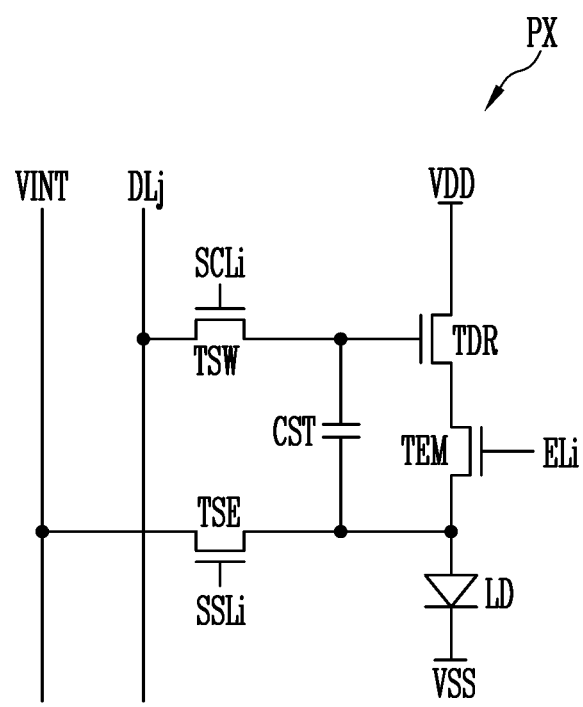
FIG. 2 is a circuit diagram of an exemplary embodiment of a representative pixel included in the display device of FIG. 1.

FIG. 2 is a circuit diagram of an exemplary embodiment of a representative pixel included in the display device of FIG. 1.

Referring to FIG. 2, the pixel PX may include a switching transistor TSW, a driving transistor TDR, a sensing transistor TSE, an emission transistor TEM, a storage capacitor CST, and a light emitting device LD. In exemplary embodiments, the emission transistor TEM may be omitted. A case where the pixel PX is a pixel disposed on an ith (i is a natural number greater than 1) row and a jth (j is a natural number) column will be described.

Although a case where the switching transistor TSW, the driving transistor TDR, the sensing transistor TSE, and the emission transistor TEM are implemented with an N-type transistor (e.g., an n-channel metal oxide semiconductor (NMOS) transistor) is illustrated in FIG. 2, exemplary embodiments are not limited thereto. For example, at least one of the switching transistor TSW, the driving transistor TDR, the sensing transistor TSE, and the emission transistor TEM may be implemented with a P-type transistor.

The gate electrode of the switching transistor TSW may be connected to an ith scan line SCLi. The switching transistor TSW may transfer a data voltage to the pixel PX in response to a scan signal supplied to the ith scan line SCLi. One electrode of the switching transistor TSW may be connected to a jth data line DLj, and the other electrode of the switching transistor TSW may be connected to one end of the storage capacitor CST and a gate electrode of the driving transistor TDR. The data voltage transferred through the switching transistor TSW may be stored in the storage capacitor CST.

One electrode of the driving transistor TDR may be connected to a first power supply line VDD, and the other electrode of the driving transistor TDR may be connected to one electrode of the emission transistor TEM. The gate electrode of the driving transistor TDR may be electrically connected to the one end of the storage capacitor CST and the other electrode of the switching transistor TSW. The driving transistor TDR may determine a magnitude of driving current flowing through the light emitting device LD according to the magnitude of the data voltage (data signal) stored in the storage capacitor CST.

The gate electrode of the sensing transistor TSE may be connected to an ith sensing line SSLi. One electrode of the sensing transistor TSE may be connected to a third power supply line VINT, and the other electrode of the sensing transistor TSE may be connected to the other end of the storage capacitor CST and an anode electrode of the light emitting device LD. The sensing transistor TSE may transfer an initialization voltage of the third power supply line VINT to the pixel PX in response to a sensing signal supplied to the ith sensing line SSLi.

The gate electrode of the emission transistor TEM may be connected to an ith emission control line ELi. The emission transistor TEM may be connected between the driving transistor TDR and the light emitting device LD, and be selectively turned on in response to an emission signal.

The storage capacitor CST may be connected to the gate electrode of the driving transistor TDR and the anode electrode of the light emitting device LD. The storage capacitor CST may store a voltage corresponding to the data voltage applied through the switching transistor TSW and a threshold voltage of the driving transistor TDR.

The anode electrode of the light emitting device LD may be connected to the driving transistor TDR via the emission transistor TEM, and a cathode electrode of the light emitting device LD may be connected to a second power supply line VSS. The light emitting device LD may generate light having a luminance corresponding to the amount of current supplied through the driving transistor TDR.

The first power source of the first power supply line VDD may be set to a voltage higher than that of the second power source of the second power supply line VS S such that a current can flow through the light emitting device LD.

Figure 3:
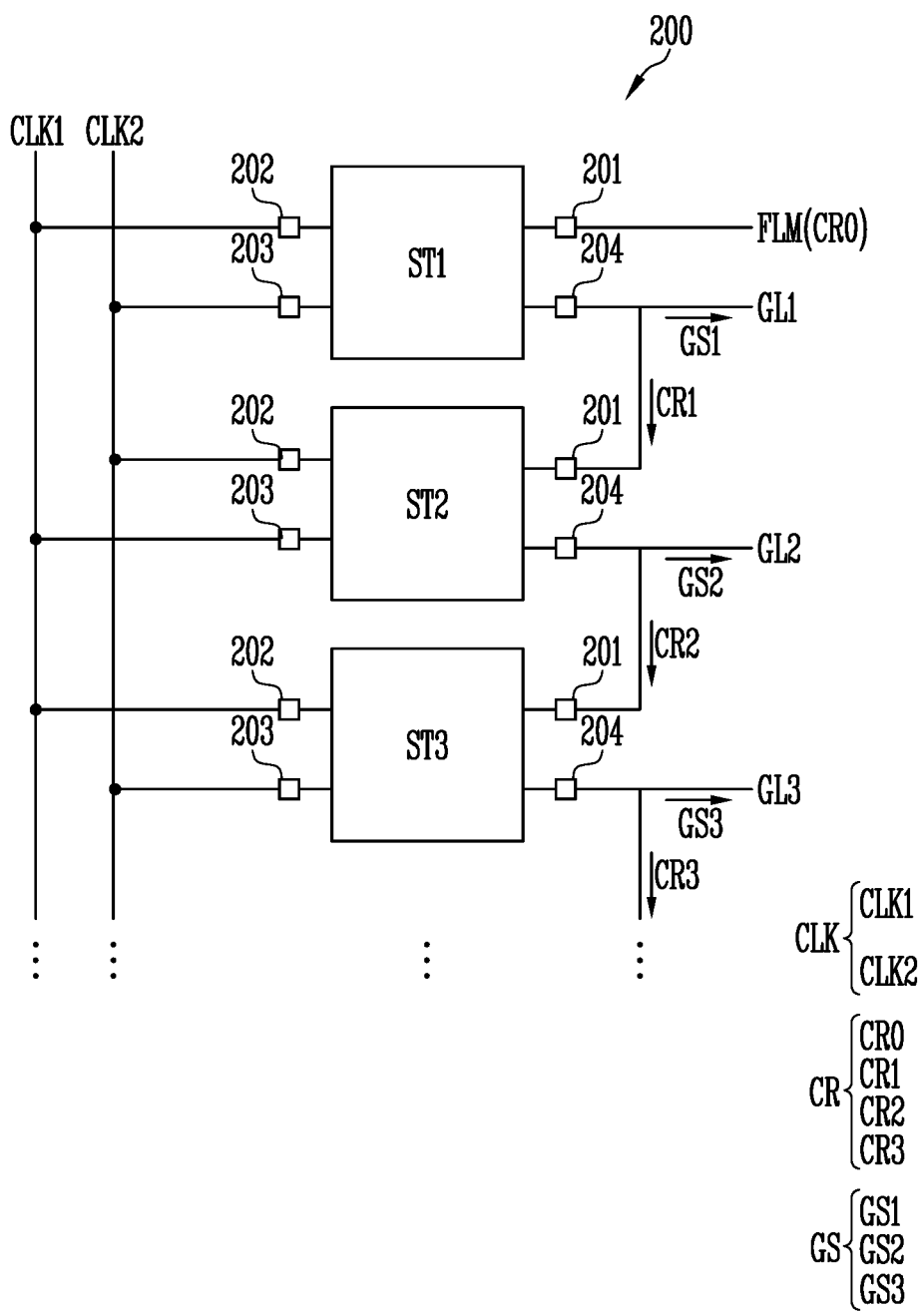
FIG. 3 is a block diagram of an exemplary embodiment of a gate driver included in the display device of FIG. 1.

FIG. 3 is a block diagram of an exemplary embodiment of a gate driver included in the display device of FIG. 1.

Referring to FIG. 3, the gate driver 200 may include stages connected to the gate lines GL1 to GLx of FIG. 1. FIG. 3 representatively shows first to third stages ST1 to ST3 that are sequentially connected to each other through carry signal lines. It is contemplated that the gate driver 200 may include stages connected to each other in various manners. For example, all the stages of the gate driver 200 may be sequentially connected to each other through carry signal lines to sequentially transfer a carry signal. As another example, the gate driver 200 may include first and second groups of stages where the stages in each of the first and second groups are sequentially connected to each other through carry signal lines. In this manner, some of the stages of the first group and some of the stages of the second group may be connected to each other through additional signal lines as necessary.

The first to third stages ST1 to ST3 may be respectively connected to corresponding gate lines GL1 to GL3, and be commonly connected to at least one clock signal line for transmitting at least one clock signal CLK. The first to third stages ST1 to ST3 may have substantially the same circuit structure.

Each of the first to third stages ST1 to ST3 may include a first input terminal 201, a second input terminal 202, a third input terminal 203, and an output terminal 204.

The first input terminal 201 may receive a carry signal CR through a carry signal line. The carry signal CR may include a start signal FLM (or carry start signal CR0) or an output signal (i.e., a gate signal) of a previous stage. For example, the first input terminal 201 of a first stage ST1 may receive the start signal FLM through a carry signal line, and the first input terminals 201 of the other stages ST2 and ST3 may respectively receive gate signals GS1 and GS2 of previous stages through carry signal lines. That is, a gate signal of a previous stage of a corresponding stage may be provided as a carry signal CR1, CR2 or CR3 to the corresponding stage.

The second input terminal 202 of the first stage ST1 may be connected to a first clock signal line to receive a first clock signal CLK1, and the third input terminal 203 of the first stage ST1 may be connected to a second clock signal line to receive a second clock signal CLK2. The second input terminal 202 of a second stage ST2 may be connected to the second clock signal line to receive the second clock signal CLK2, and the third input terminal 203 of the second stage ST2 may be connected to the first clock signal line to receive the first clock signal CLK1.

Like the first stage ST1, the second input terminal 202 of a third stage ST3 may be connected to the first clock signal line to receive the first clock signal CLK1, and the third input terminal 203 of the third stage ST3 may be connected to the second clock signal line to receive the second clock signal CLK2.

That is, the first clock signal line and the second clock signal line may be alternately connected to the second input terminal 202 and the third input terminal 203 of each of the stages ST1, ST2, and ST3, and the first clock signal CLK1 and the second clock signal CLK2 may be alternately provided to the second input terminal 202 and the third input terminal 203 of each of the stages ST1, ST2, and ST3.

Pulses of the first clock signal CLK1 provided through the first clock signal line and pulses of the second clock signal CLK2 provided through the second clock signal line may not overlap with each other in time. Each of the pulses may have a turn-on voltage level.

The stages ST1 to ST3 may receive a fourth voltage and a fifth voltage. In an exemplary embodiment, the fourth voltage may be set to a turn-on voltage level, and the fifth voltage may be set to a turn-off voltage level.

Each of the first to third stages ST1 to ST3 may include a plurality of transistors, and output a gate signal GS as a pulse using at least one of the first and second clock signals CLK1 and CLK2, based on various signals provided to each of the stages ST1 to ST3. The output gate signal GS may be provided as the carry signal CR to a next stage.

Specifically, the output terminal 204 of the first stage ST1 may be connected to a first gate line GL1 to transfer a first gate signal GS1 to the pixel PX of FIG. 1, and the first gate signal GS1 may be provided as a first carry signal CR1 to the first input terminal 201 of the second stage ST2. The output terminal 204 of the second stage ST2 may be connected to a second gate line GL2 to transfer a second gate signal GS2 to the pixel PX, and the second gate signal GS2 may be provided as a second carry signal CR2 to the first input terminal 201 of the third stage ST3. The output terminal 204 of the third stage ST3 may be connected to a third gate line GL3 to transfer a third gate signal GS3 to the pixel PX, and the third gate signal GS3 may be provided as a third carry signal CR3 to the first input terminal 201 of a next stage (e.g., a fourth stage) of the third stage ST3.

Figure 4:
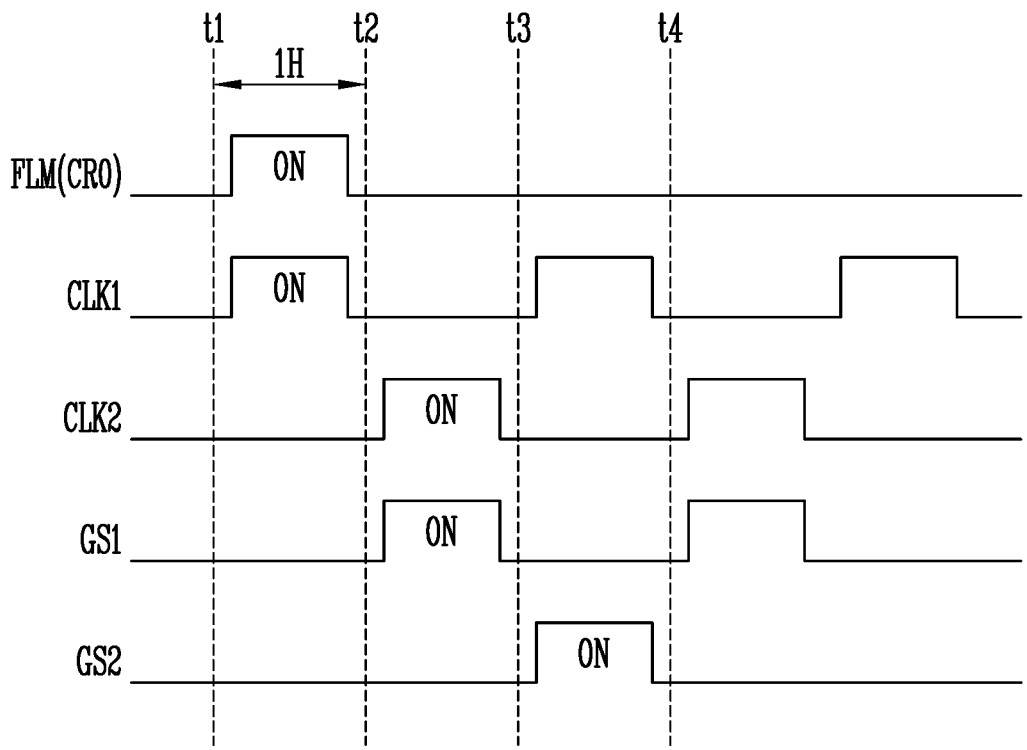
FIG. 4 is a waveform timing diagram of an exemplary embodiment of signals of first and second stages, which are included in the gate driver of FIG. 3.

FIG. 4 is a waveform timing diagram of an exemplary embodiment of signals of first and second stages, which are included in the gate driver of FIG. 3. First to fourth times t1, t2, t3, and t4 are set at an interval of one horizontal period 1H.

Referring to FIGS. 3 and 4, between the first time t1 and the second time t2, the first clock signal CLK1 may be transitioned from the turn-off voltage level to the turn-on voltage level and then again transitioned to the turn-off voltage level. That is, between the first time t1 and the second time t2, the first clock signal CLK1 may have a pulse having a turn-on voltage level.

Also, between the first time t1 and the second time t2, the start signal FLM may be transitioned from the turn-off voltage level to the turn-on voltage level and then again transitioned to the turn-off voltage level. That is, between the first time t1 and the second time t2, the start signal FLM may have a pulse having the turn-on voltage level. An interval before the first time t1 is before the start signal FLM having the turn-on voltage level is applied, and may be defined as an initialization interval.

Subsequently, between the second time t2 and the third time t3, the second clock signal CLK2 may be transitioned from the turn-off voltage level to the turn-on voltage level and then again transitioned to the turn-off voltage level. That is, between the second time t2 and the third time t3, the second clock signal CLK2 may have a pulse having the turn-on voltage level.

The first clock signal CLK1 and the second clock signal CLK2 may have the same period (e.g., two horizontal periods 2H), and the pulse of the second clock signal CLK2 may appear later by one horizontal period 1H than the pulse of the first clock signal CLK1. That is, the second clock signal CLK2 may be a signal obtained by shifting the first clock signal CLK1 by one horizontal period 1H (or a half period of the first clock signal CLK1).

Each stage may output one of the first and second clock signals CLK1 and CLK2 as a gate signal GS in a next horizontal period in response to receiving a pulse of the start signal FLM or the carry signal CR of a previous stage. Between the second time t2 and the third time t3, the first stage ST1 may output the second clock signal CLK2 as the first gate signal GS1. As described above, between the second time t2 and the third time t3, the second clock signal CLK2 may have a pulse having the turn-on voltage level, and accordingly, the first gate signal GS1 may also have the pulse having the turn-on voltage level.

The second stage ST2 that receives the first gate signal GS1 of the first stage ST1 as the first carry signal CR1 may prepare the output of the second gate signal GS2 in response to the first gate signal GS1 having the turn-on voltage level.

Between the third time t3 and the fourth time t4, the first clock signal CLK1 may have a pulse having the turn-on voltage level. The second stage ST2 may output the first clock signal CLK1 as the second gate signal GS2. As described above, between the third time t3 and the fourth time t4, the first clock signal CLK1 may have a pulse having the turn-on voltage level, and accordingly, the second gate signal GS2 may also have a pulse having the turn-on voltage level.

The third stage ST3 that receives the second gate signal GS2 of the second stage ST2 as the second carry signal CR2 may prepare the output of the third gate signal GS3 in response to the second gate signal GS2 having the turn-on voltage level.

After the fourth time t4, next stages may sequentially output the gate signal GS at an interval of one horizontal period 1H.

Figure 5:
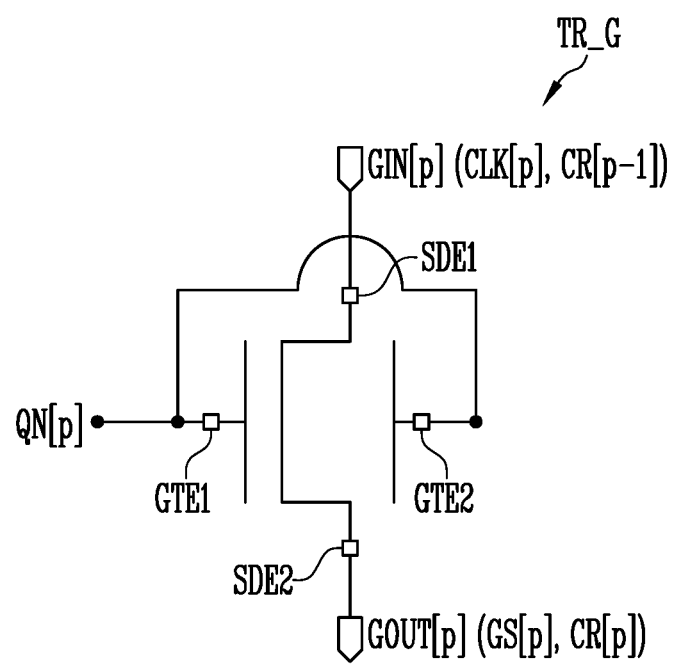
FIG. 5 is a circuit diagram of an exemplary embodiment of a thin film transistor included in the gate driver of FIG. 3.

FIG. 5 is a circuit diagram of an exemplary embodiment of a thin film transistor included in the gate driver of FIG. 3. The thin film transistor TR_G shown in FIG. 5 may be one of a plurality of transistors included in each of the stages of the gate driver 200, such as the first to third stages ST1 to ST3 shown in FIG. 3.

Referring to FIGS. 3 to 5, the thin film transistor TR_G includes a first gate electrode, a second gate electrode, a first electrode, and a second electrode, and may include a first gate terminal GTE1, a second gate terminal GTE2, a transistor input terminal SDE1, and a transistor output terminal SDE2, which are respectively connected to the first gate electrode, the second gate electrode, the first electrode, and the second electrode. The first electrode may be any one of source and drain electrodes of the thin film transistor TR_G, and the second electrode may be the other of the source and drain electrodes of the thin film transistor TR_G.

The thin film transistor TR_G shown in FIG. 5 may be an arbitrary transistor included in a pth (p is a natural number) stage disposed on a pth row among the plurality of stages shown in FIG. 3.

The thin film transistor TR_G may be a transistor having a double-gate structure including two gate electrodes. The first gate terminal GTE1 and the second gate terminal GTE2 may be terminals respectively connected to the gate electrodes of the thin film transistor TR_G.

The first gate terminal GTE1 may be a terminal connected between a pth charge node QN[p] and the first gate electrode of the thin film transistor TR_G. The first gate terminal GTE1 may be connected to the pth charge node QN[p], and the charge voltage of the pth charge node QN[p] may be applied to the first gate terminal GTE1. The first gate terminal GTE1 may transfer the charge voltage to the first gate electrode of the thin film transistor TR_G.

In an exemplary embodiment, the charge voltage may have a voltage level higher than that of the pulses having the turn-on voltage level, which belong to the first and second clock signals CLK1 and CLK2 described with reference to FIG. 4. For example, the pth charge node QN[p] may have a boost-up voltage level higher than the turn-on voltage level due to bootstrap of a capacitor connected to the pth charge node QN[p], and the charge voltage of the pth charge node QN[p] may be 45 V or higher. In another exemplary embodiment, the pth charge node QN[p] may have a voltage level equal to that of the pulses having the turn-on voltage level, which belong to the clock signals CLK1 and CLK2, and the charge voltage of the pth charge node QN[p] may be 36 V or lower.

The second gate terminal GTE2 may be a terminal connected between the pth charge node QN[p] and the second gate electrode of the thin film transistor TR_G. The second gate terminal GTE2 may be connected to the pth charge node QN[p], and the charge voltage from the pth charge node QN[p] may be applied to the second gate terminal GTE2. The second gate terminal GTE2 may transfer the charge voltage to the second gate electrode of the thin film transistor TR_G.

That is, the first gate electrode and the second gate electrode of the thin film transistor TR_G are commonly connected to the pth charge node QN[p]. Therefore the same charge voltage transferred from the pth charge node QN[p] may be applied to the first gate electrode and the second gate electrode.

The transistor input terminal SDE1 may be a terminal connected between a pth input signal line and the first electrode of the thin film transistor TR_G. The transistor input terminal SDE1 may be connected to the pth input signal line to receive a pth input signal GIN[p], and transfer the pth input signal GIN[p] to the thin film transistor TR_G.

Each stage of the gate driver 200 may include at least one of a first transistor to receive a clock signal CLK[p] through its drain or source and a second transistor to receive a carry signal CR[p−1] through its drain or source. In this manner, at least one of the first transistor and the second transistor may be implemented as the thin film transistor TR_G. In an exemplary embodiment, the pth input signal GIN[p] received to the transistor input terminal SDE1 may be a clock signal CLK[p]. That is, the transistor input terminal SDE1 may be directly connected to the clock signal line (see FIG. 3) to receive the clock signal CLK[p].

The clock signal CLK[p] may be any one of the first clock signal CLK1 and the second clock signal CLK2, which are described with reference to FIG. 3. As described in FIG. 4, the clock signal CLK[p] may be a signal including pulses that have a certain period (e.g., two horizontal periods 2H) and are repeated. The pulses included in the clock signal CLK[p] may be pulses having the turn-on voltage level.

In another exemplary embodiment, the pth input signal GIN[p] received to the transistor input terminal SDE1 may be a (p−1)th carry signal CR[p−1] provided from a previous stage (e.g., a (p−1)th stage). The (p−1)th carry signal CR[p−1] may be a signal identical to a gate signal output from the previous stage. That is, the transistor input terminal SDE1 may be directly connected to the carry signal line (see FIG. 3) to receive the (p−1)th carry signal CR[p−1].

The pth input signal GIN[p] provided to the thin film transistor TR_G through the transistor input terminal SDE1 may have a pulse having the turn-on voltage level.

The transistor output terminal SDE2 may be a terminal connected between a pth output signal line and the second electrode of the thin film transistor TR_G. The transistor output terminal SDE2 may receive a pth output signal GOUT[p] from the thin film transistor TR_G, and transfer the pth output signal GOUT[p] to the pth output signal line.

In an exemplary embodiment, the pth output signal GOUT[p] output from the transistor output terminal SDE2 may be a pth gate signal GS[p] (or pth carry signal CR[p]). The pth gate signal GS[p] may be a gate signal output by a pth stage. The pth gate signal GS[p] may be supplied to each pixel PX of FIG. 1 through the pth output signal line (e.g., a pth gate line). The pth gate signal GS[p] may include a clock signal as a pulse, and the pulse included in the pth gate signal GS[p] may have the turn-on voltage level.

The pth gate signal GS[p] output from the transistor output terminal SDE2 may be provided as the pth carry signal CR[p] to a next stage (e.g., a (p+1)th stage). That is, the pth carry signal CR[p] may be a signal identical to the pth gate signal GS[p] output from the pth stage. The (p+1)th stage may receive the pth carry signal CR[p] and output a (p+1)th gate signal.

When the voltage level of the pth input signal GIN[p] input to the transistor input terminal SDE1 of the thin film transistor TR_G is lower than about 36 V, degradation problems typically do not occur in the thin film transistor TR_G to which the pth input signal GIN[p] is provided, or the problem caused by degradation may be insignificant.

However, when the voltage level of the pth input signal GIN[p] is at a level of about 36 V or higher, a problem may occur due to degradation of the thin film transistor TR_G to which the pth input signal GIN[p] is provided. That is, when the pth input signal GIN[p] having a high voltage level is provided, electrical characteristics of the thin film transistor TR_G may deteriorate when time elapses.

For example, the current maintenance ratio of the thin film transistor may gradually decrease due to degradation of the thin film transistor. Specifically, the current maintenance ratio of the thin film transistor means a ratio of a drain current before a voltage having a high voltage level (e.g., a level of about 36 V or higher) is applied to the thin film transistor and a drain current after the voltage having the high voltage level is applied for 12 hours. When the current maintenance ratio decreases to 80% or less due to the degradation of the thin film transistor, the gate driver may not be stably driven.

When the size of the thin film transistor is increased, the degradation of the thin film transistor due to the high voltage level can be minimized. However, the area of a dead space of the peripheral region PR of FIG. 1 is also increased due to the increase in size of the thin film transistor, and therefore, it is difficult to secure a narrow bezel.

In order to solve the above-described problems, the first gate electrode GTE1 and the second gate electrode GTE2 may be synchronized with each other to have substantially the same voltage. The thin film transistor TR_G may include the first and second gate electrodes GTE1 and GTE2 electrically connected to a common node such as the pth charge node QN[p]. When the first gate electrode GTE1 and the second gate electrode GTE2 have substantially the same voltage, the degradation characteristics of the thin film transistor TR_G can be improved.

Specifically, when the thin film transistor TR_G has a synchronous gate electrode structure, the thin film transistor TR_G is not easily degraded but may constantly maintain an amount of current flowing therethrough even when a signal such as the pth clock signal CLK[p] and the (p−1)th carry signal CR[p−1] having a high voltage level is applied.

For example, in a thin film transistor having an asynchronous single gate electrode structure, when a clock signal having about 36 V or higher is applied, the current maintenance ratio of the thin film transistor may be 85% or less. When a clock signal having about 45 V or higher is applied, the current maintenance ratio of the thin film transistor may be 40% or less.

However, in the thin film transistor TR_G having the synchronous gate electrode structure, when the clock signal CLK[p] having about 36 V or higher is applied, the current maintenance ratio of the thin film transistor TR_G may be 95% or more. When the clock signal CLK[p] having about 45 V or higher is applied, the current maintenance ratio of the thin film transistor TR_G may be 90% or more.

That is, when the thin film transistor TR_G includes the first gate electrode and the second gate electrode, which are synchronized with each other, the current maintenance ratio characteristic can be further improved compared to the case when the thin film transistor TR_G includes first and second gate electrodes that are not synchronized with each other.

In addition, when the thin film transistor TR_G includes the first gate electrode and the second gate electrode, which are synchronized with each other, current or charges may flow through the thin film transistor TR_G effectively and/or efficiently, and accordingly the thin film transistor TR_G may have an improved carrier (or charge) mobility characteristic. For example, a carrier mobility of the thin film transistor TR_G including the first gate electrode and the second gate electrode, which are synchronized with each other, may increase by about 1.5 times as compared with a thin film transistor having a single gate electrode structure.

When the carrier mobility of the thin film transistor TR_G increases, the size of the thin film transistor TR_G can be decreased, and a narrow bezel of the display device can be effectively and efficiently implemented.

Although a case where the thin film transistor TR_G is an N-type transistor (e.g., an n-channel metal oxide semiconductor (NMOS) transistor) is illustrate in FIG. 5, exemplary embodiments are not limited thereto, and the thin film transistor TR_G may be a P-type transistor.

Figure 6:
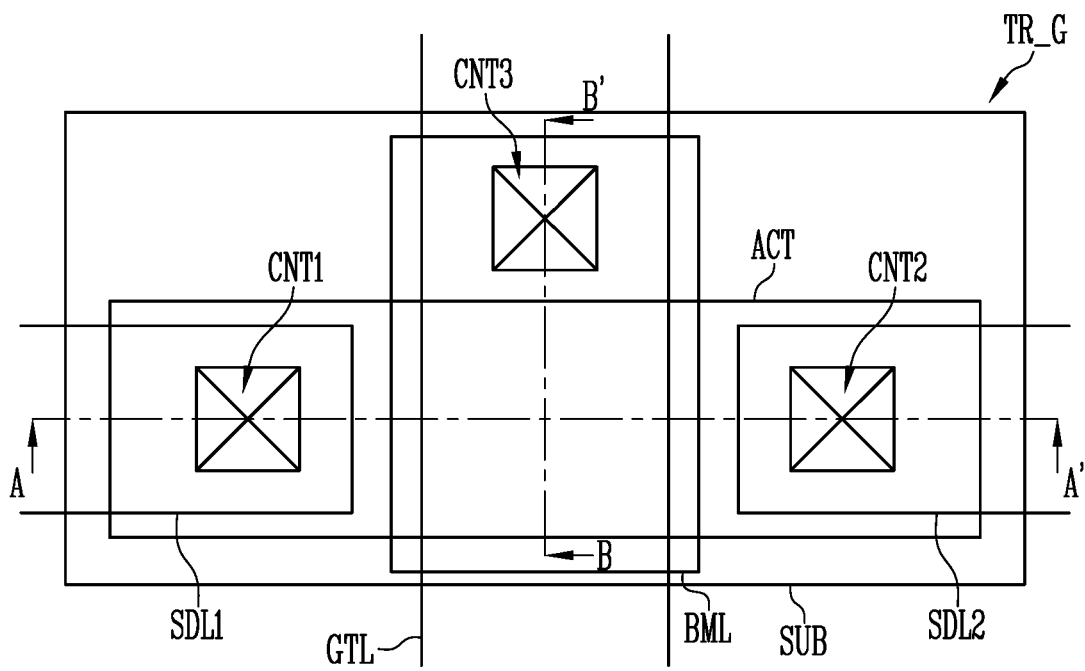
FIG. 6 is a schematic plan view of an exemplary embodiment of the thin film transistor of FIG. 5.
Figure 7:
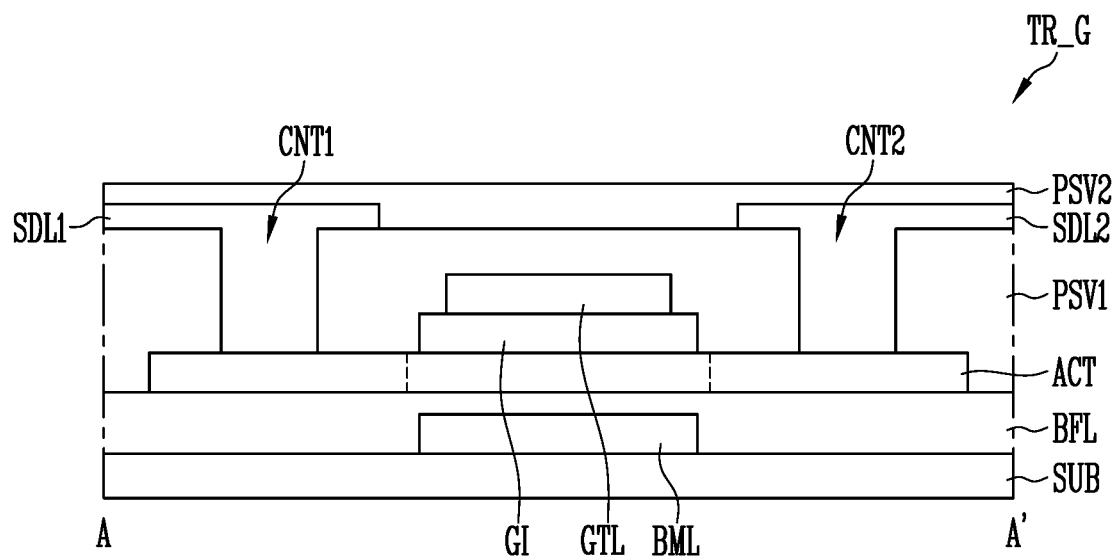
FIG. 7 is a cross-sectional view taken along line A-A' of FIG. 6.
Figure 8:
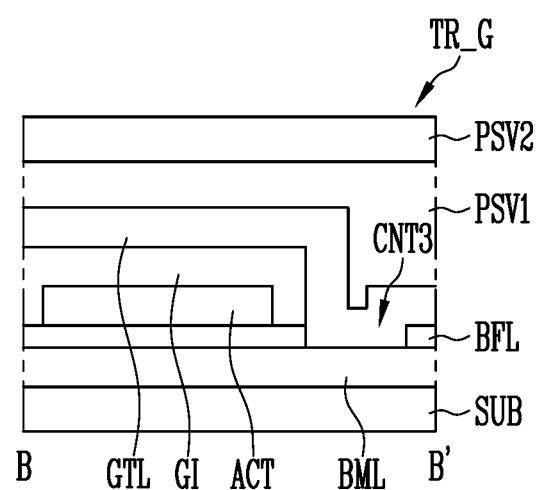
FIG. 8 is a cross-sectional view taken along line B-B' of FIG. 6.

FIG. 6 is a schematic plan view of an exemplary embodiment of the thin film transistor of FIG. 5. FIG. 7 is a cross-sectional view taken along line A-A' of FIG. 6. FIG. 8 is a cross-sectional view taken along line B-B' of FIG. 6.

Referring to FIGS. 6 to 8, the thin film transistor TR_G may include a substrate SUB, and a first electrode layer BML, an active layer ACT, a second electrode layer GTL, a third electrode layer SDL1, and a fourth electrode layer SDL2, which are disposed on the substrate SUB. Also, the thin film transistor TR_G may further include layers for insulating or protecting components of the thin film transistor TR_G. For example, the thin film transistor TR_G may include a buffer layer BFL, a gate insulating layer GI, a first protective layer PSV1, and a second protective layer PSV2.

The substrate SUB may be a rigid type base substrate or a flexible type base substrate. The rigid type base substrate may include at least one of a glass base substrate, a quartz base substrate, a glass ceramic base substrate, and a crystalline glass base substrate. The flexible type base substrate may include at least one of a film base substrate and a plastic base substrate, which include a polymer organic material. The material applied to the substrate SUB may have resistance (or heat resistance) against high processing temperature in a manufacturing process.

The first electrode layer BML may be disposed on the substrate SUB. The first electrode layer BML may be formed to have an area smaller than that of the substrate SUB when viewed in plan. In an exemplary embodiment, the first electrode layer BML may be formed to include a metal layer including at least one of copper (Cu), chromium (Cr), molybdenum (Mo), and alloys thereof.

When viewed in plan, at least a portion of the first electrode layer BML may overlap with the active layer ACT which will be described later. A region of the first electrode layer BML that does not overlap with the active layer ACT may be a region in which the first electrode layer BML is in contact with the second electrode layer GTL which will be described later.

The buffer layer BFL may be disposed over the first electrode layer BML. The buffer layer BFL may be formed to cover the first electrode layer BML, and be entirely disposed on the substrate SUB. The buffer layer BFL may protect characteristics of the active layer ACT by blocking an impurity (e.g., oxygen and/or moisture) penetrating through the substrate SUB weak to moisture, and function to reduce stress applied to the substrate SUB.

The buffer layer BFL may be formed in a single layer made of one of silicon nitride (SiNx), silicon oxide (SiOx) or silicon oxynitride (SiOxNy) or in a multi-layer in which one or more inorganic layers are alternately stacked. The buffer layer BFL may be entirely deposited on the substrate SUB by using Chemical Vapor Deposition (CVD).

The active layer ACT as a semiconductor layer may be formed on the substrate SUB. The active layer ACT may include a channel region, and a source region and a drain region, which are respectively formed at both sides of the channel region. The channel region may overlap with the first electrode layer BML and/or the second electrode layer GTL which will be described later. The source region and the drain region may be electrically connected to the third electrode layer SDL1 and the fourth electrode layer SDL2, which will be described later, through a first contact hole CNT1 and a second contact hole CNT2, respectively.

The active layer ACT may include an oxide semiconductor. For example, the active layer ACT may include an oxide semiconductor such as Indium Gallium Zinc Oxide (IGZO), Zinc Tin Oxide (ZTO), or Indium Tin Zinc Oxide (ITZO).

When viewed in plan, the active layer ACT may be disposed such that at least a portion of the active layer ACT overlaps with the first electrode layer BML while intersecting the first electrode layer BML. In an exemplary embodiment, a region overlapping with the first electrode layer BML and/or the second electrode layer GTL may be the channel region, and regions that do not overlap with the first electrode layer BML and/or the second electrode layer GTL may be the source region and the drain electrode.

The gate insulating layer GI may be provided on the substrate SUB on which the active layer ACT is formed. The gate insulating layer GI may include at least one of an organic insulating layer and an inorganic insulating layer. The gate insulating layer GI may be disposed over the active layer ACT to insulate the active layer ACT and the second electrode layer GTL from each other.

As shown in FIG. 7, the gate insulating layer GI may be disposed such that at least a portion of the gate insulating layer GI overlaps with the channel region of the active layer ACT. In exemplary embodiments, the gate insulating layer GI may be disposed such that a portion of the gate insulating layer GI overlaps with the source region and/or the drain region. Also, the gate insulating layer GI may cover a side surface of the active layer ACT as shown in FIG. 8. However, exemplary embodiments are not limited thereto, and the gate insulating layer GI may cover a portion of the side surface of the active layer, or may not cover the side surface of the active layer ACT.

The second electrode layer GTL may overlap with the channel region of the active layer ACT on the gate insulating layer GI, and be formed to extend along one direction. The second electrode layer GTL may be a gate electrode layer of the thin film transistor TR_G. That is, the amount of current flowing in the active layer ACT may be controlled according to a voltage applied to the second electrode layer GTL.

The second electrode layer GTL may be formed in a single layer or multi-layer made of any one of molybdenum (Mo), aluminum (Al), chromium (Cr), gold (Au), titanium (Ti), nickel (Ni), neodymium (Nd), and copper (Cu), or any alloy thereof.

As shown in FIG. 8, the second electrode layer GTL may be in contact with the first electrode layer BML through a third contact hole CNT3 in a region in which the second electrode layer GTL does not overlap with the active layer ACT. The first electrode layer BML may include a first region overlapping the active layer ACT and a second region not overlapping the active layer ACT, the second region of the first electrode layer BML may be at least partially exposed by the third contact hole CNT3 formed in the buffer layer BFL. The second electrode layer GTL may contact the exposed portion of the second region of the first electrode layer BML. In this manner, the gate insulating layer GI disposed below the second electrode layer GTL may also have a shape at least partially exposing the second region of the first electrode layer BML together with the third contact hole CNT3. Accordingly, the voltage applied to the second electrode layer GTL can be transferred to the first electrode layer BML. That is, the first electrode layer BML and the second electrode layer GTL may be directly connected to each other, to be synchronized with each other so as to have substantially the same voltage. The first electrode layer BML to which substantially the same voltage as that of the second electrode layer GTL is applied may also be the gate electrode layer of the thin film transistor TR_G.

As described above, when the first electrode layer BML and the second electrode layer GTL are synchronized with each other to have substantially the same voltage, the current maintenance ratio characteristic of the thin film transistor TR_G can be improved. Further, the carrier mobility characteristic of the thin film transistor TR_G can be improved. Accordingly, the size of the thin film transistor TR_G can be decreased, and a narrow bezel of the display device can be effectively and efficiently implemented.

The first protective layer PSV1 covering the active layer ACT and the second electrode layer GTL may be provided over the second electrode layer GTL. The first protective layer PSV1 protects components disposed on the substrate SUB, and performs planarization by compensating for a step difference generated by each component. The first protective layer PSV1 may include the first contact hole CNT1 exposing a portion of the active layer ACT and the second contact hole CNT2 exposing other portion of the active layer ACT. The first protective layer PSV1 may include at least one of an organic insulating layer and an inorganic insulating layer.

The third electrode layer SDL1 connected to the source region of the active layer ACT through the first contact hole CNT1 and the fourth electrode layer SDL2 connected to the drain region of the active layer ACT through the second contact hole CNT2 may be formed on the first protective layer PSV1. The third electrode layer SDL1 and the fourth electrode layer SDL2 may extend in a direction intersecting that in which the second electrode layer GTL extends.

In an exemplary embodiment, any one of the third electrode layer SDL1 and the fourth electrode layer SDL2 may be directly connected to the clock signal line (see FIG. 3) to receive a clock signal. In addition, the other of the third electrode layer SDL1 and the fourth electrode layer SDL2 may be directly connected to the gate signal line (see FIG. 3) to output a gate signal.

In another exemplary embodiment, any one of the third electrode layer SDL1 and the fourth electrode layer SDL2 may be directly connected to the carry signal line to receive a carry signal.

The third electrode layer SDL1 and the fourth electrode layer SDL2 may be formed in a single layer or multi-layer made of any one of molybdenum (Mo), aluminum (Al), chromium (Cr), gold (Au), titanium (Ti), nickel (Ni), neodymium (Nd), and copper (Cu), or any alloy thereof. In an example, the third electrode layer SDL1 and the fourth electrode layer SDL2 may include a low-resistance metal. For example, the low-resistance metal may have an aluminum alloy structure in which titanium (Ti), aluminum (Al), and titanium (Ti) are sequentially stacked. However, this is merely illustrative, and the low-resistance metal is not limited thereto.

The second protective layer PSV2 may be provided on the first protective layer PSV1 on which the third electrode layer SDL1 and the fourth electrode layer SDL2 are disposed. The second protective layer PSV2 may include at least one of an organic insulating layer and an inorganic insulating layer.

The structure of the thin film transistor is not limited to the above-described embodiment. The detailed structure of the thin film transistor may be different from the structure described with reference to FIGS. 6 to 8 as long as the thin film transistor has a structure in which the first electrode layer BML and the second electrode layer GTL can be electrically connected to each other.

As described above, the transistor included in the gate driver can be implemented with an oxide semiconductor transistor in which gate electrodes are disposed on the top and bottom of an active layer, and the gate electrode (e.g., the second electrode layer GTL) disposed on the top of the active layer and the gate electrode (e.g., the first electrode layer BML) disposed on the bottom of the active layer are synchronized with each other.

Figure 9:
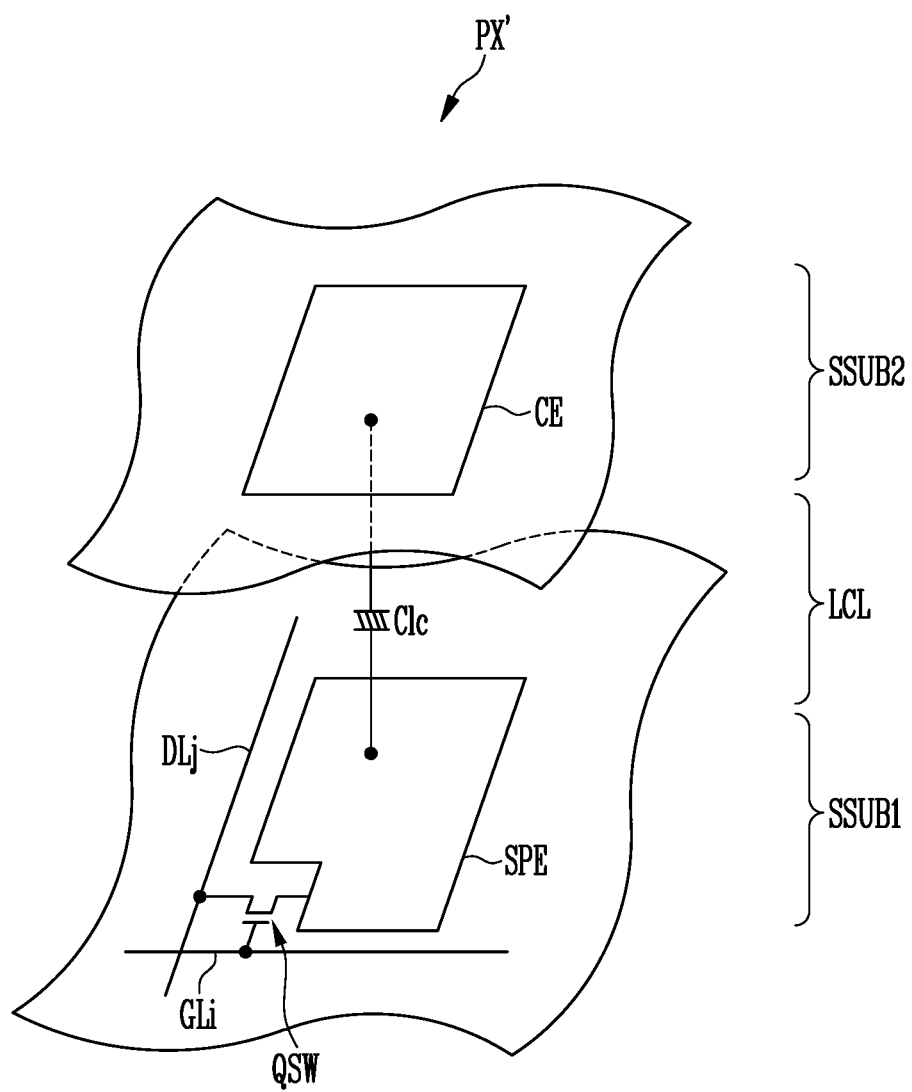
FIG. 9 is a circuit diagram of another exemplary embodiment of a representative pixel included in the display device of FIG. 1.

FIG. 9 is a circuit diagram of another exemplary embodiment of a representative pixel included in the display device of FIG. 1. The illustrated embodiment shown in FIG. 9 is different from the illustrated embodiment shown in FIG. 2 in that the pixel shown in FIG. 9 is a pixel including a liquid crystal layer, and the other components may be similar to those of the embodiment shown in FIG. 2. Hereinafter, differences will be mainly described.

Referring to FIGS. 1 and 9, the pixel PX' may include a lower display plate SSUB1, an upper display plate SSUB2, and a liquid crystal layer LCL disposed between the lower display plate SSUB1 and the upper display plate SSUB2.

The lower display plate SSUB1 may include a pixel electrode SPE, a gate line GLi and a data line DLj, which are adjacent to the pixel electrode SPE, and a switching element QSW connected to each of the gate line GLi and the data line DLj.

The pixel electrode SPE along with a common electrode CE which will be described later may form an electric field in the liquid crystal layer LCL, thereby controlling the alignment direction of liquid crystals in the pixel PX'. Transmission of incident light incident into the liquid crystal layer LCL and a transmission amount of the incident light may be determined according to the alignment direction and alignment degree of the liquid crystals.

The switching element QSW may be provided on the lower display plate SSUB1. The first electrode of the switching element QSW may be connected to the data line DLj (j is a natural number), and a second electrode of the switching element QSW may be connected to the pixel electrode SPE. The gate electrode of the switching element QSW may be connected to the gate line GLi (i is a natural number). The switching element QSW may transfer a driving signal to the pixel electrode SPE or block a driving signal from being transferred to the pixel electrode SPE.

The liquid crystal capacitor Clc may have, as two terminals, the pixel electrode SPE of the lower display plate SSUB1 and the common electrode CE of the upper display plate SSUB2, and the liquid crystal layer LCL between the pixel electrode SPE and the common electrode CE may serve as a dielectric. The pixel electrode SPE may be connected to the switching element QSW. The common electrode CE is formed on a front surface of the upper display plate SSUB2, and is applied with a common voltage. In an exemplary embodiment, the common electrode CE may be provided on the lower display plate SSUB1. At least one of the pixel electrode SPE and the common electrode CE may be formed in a linear or elongated bar shape.

The pixel PX' may further include a color filter. In an exemplary embodiment, the color filter may be formed above or under the common electrode CE of the upper display plate SSUB2. In another exemplary embodiment, the color filter may be formed above or under the pixel electrode SPE of the lower display plate SSUB1.

In addition, a polarizer for polarizing light may be disposed on an outer surface of at least one of the lower display plate SSUB1 and the upper display plate SSUB2.

The data driver 200 disposed on the display panel 100 may provide a gate signal to each pixel PX' of the display 110 through the gate lines GL1 to GLx. The detailed description of the gate driver 200 is identical or similar as described above, and therefore will be omitted to avoid redundancy.

Figure 10:
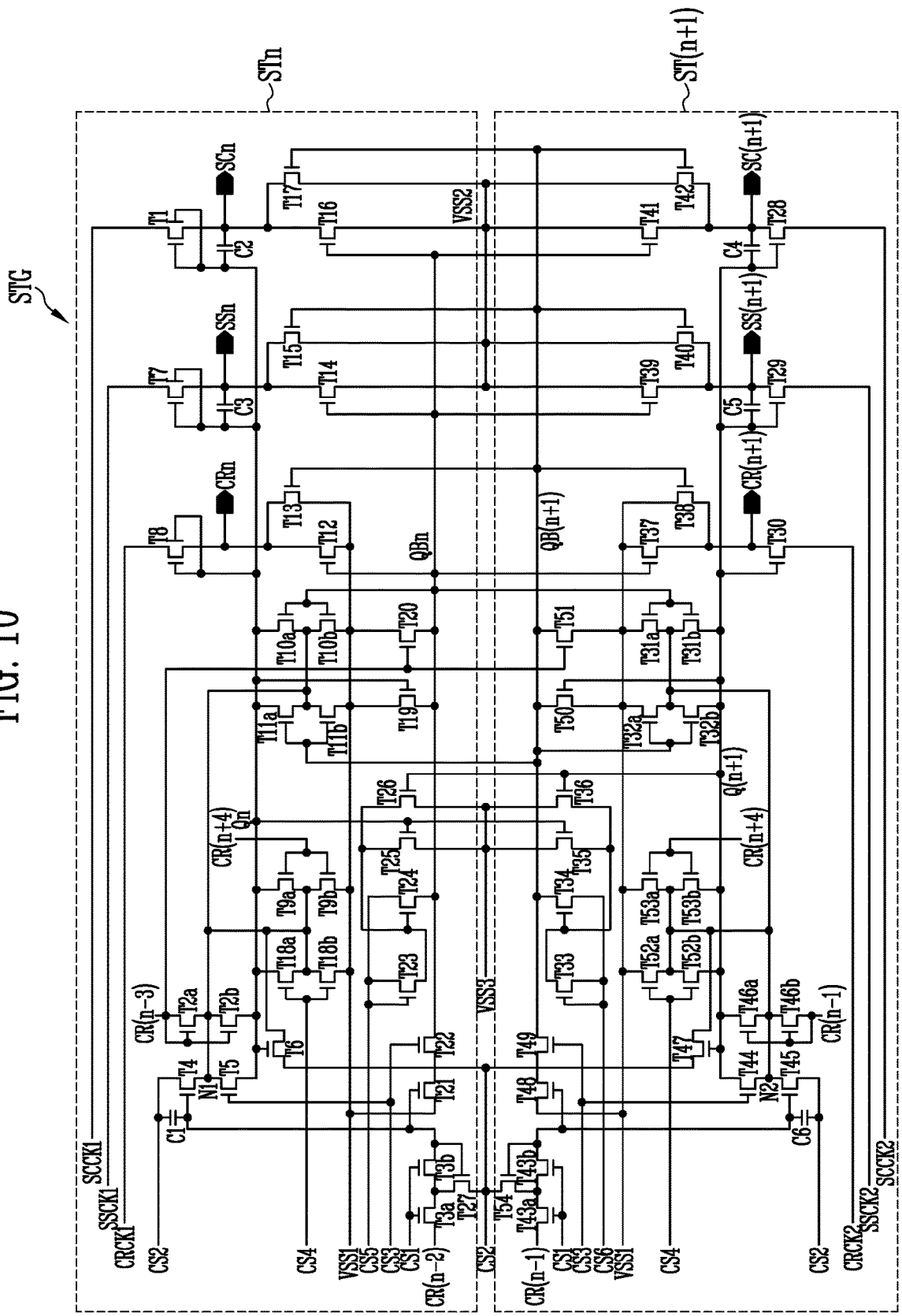
FIG. 10 is a circuit diagram of an exemplary embodiment of stages included in the gate driver of FIG. 3.
Figure 11:
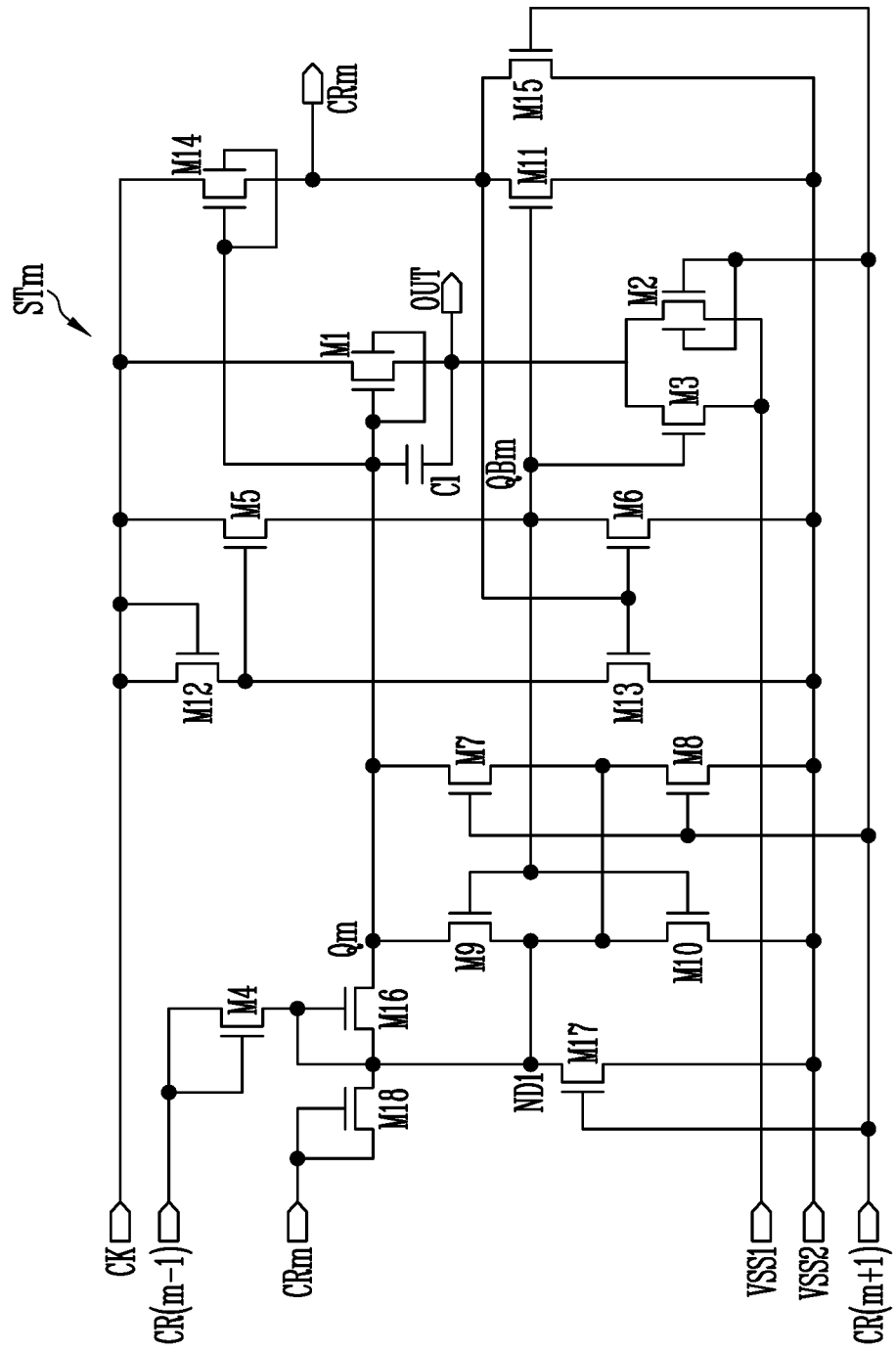
FIG. 11 is a circuit diagram of another exemplary embodiment of a stage included in the gate driver of FIG. 3.

FIG. 10 is a circuit diagram of an exemplary embodiment of stages included in the gate driver of FIG. 3. FIG. 11 is a circuit diagram of another exemplary embodiment of a stage included in the gate driver of FIG. 3. The stages shown in FIGS. 10 and 11 may include the thin film transistor TR_G shown in FIG. 5. Stages in accordance with various exemplary embodiments will be described with reference to FIGS. 10 and 11 in conjunction with FIG. 5.

Referring to FIG. 10, a stage group STG including a first gate stage STn and a second gate stage ST(n+1) is illustrated. The first gate state STn may be an odd-numbered stage among the stages included in the gate driver 200 shown in FIG. 3, and the second gate stage ST(n+1) may be an even-numbered stage posterior to the first gate stage STn among the stages included in the gate driver 200 shown in FIG. 3.

The first and second gate stages STn and ST(n+1) may be connected to first to sixth control lines CS1, CS2, CS3, CS4, CS5, and CS6. Common control signals may be applied to the first and second gate stages STn and ST(n+1) through the first to sixth control lines CS1 to CS6.

The first and second gate stages STn and ST(n+1) may be connected to corresponding clock lines among scan clock lines SCCK1 and SCCK2, sensing clock lines SSCK1 and SSCK2, and carry clock lines CRCK1 and CRCK2. Each of the scan clock lines SCCK1 and SCCK2, the sensing clock lines SSCK1 and SSCK2, and the carry clock lines CRCK1 and CRCK2 may be provided as one of the first and second clock signal lines respectively supplying the first and second clock signals CLK1 and CLK2 of FIG. 3.

The first gate stage STn may be connected to a first scan line SCn, a first sensing line SSn, and a first carry line CRn, and the second gate stage ST(n+1) may be connected to a second scan line SC(n+1), a second sensing line SS(n+1), and a second carry line CR(n+1).

The first gate stage STn may include transistors T1 to T27 and capacitors C1 to C3. Hereinafter, although a case where transistors T1 to T54 are implemented with an N-type transistor (e.g., an NMOS transistor) is assumed and described, those skilled in the art may design the stage group STG by replacing some or all of the transistors T1 to T54 with a P-type transistor (e.g., a PMOS transistor).

The first transistor T1 may include a first gate electrode and a second gate electrode, and the first and second gate electrodes may be synchronized with each other. The first and second gate electrodes of the first transistor T1 may be connected to a first Q node Qn, one electrode of the first transistor T1 may be a first scan clock line SCCK1, and the other electrode of the first transistor T1 may be connected to the first scan line SCn.

The gate electrode and one electrode of a second transistor may be connected to a first scan carry line CR(n−3), and the other electrode of the second transistor may be the first Q node Qn. For example, a carry signal output from a second gate stage of any one of previous stage groups may be applied to the first scan carry line CR(n−3). In exemplary embodiments, the second transistor may include sub-transistors T2a and T2b connected in series. The gate electrode and one electrode of the sub-transistor T2a may be connected to the first scan carry line CR(n−3), and the other electrode of the sub-transistor T2a may be connected to a first node N1. The gate electrode of the sub-transistor T2b may be connected to the first scan carry line CR(n−3), one electrode of the sub-transistor T2b may be connected to the first node N1, and the other electrode of the sub-transistor T2b may be connected to the first Q node Qn.

The gate electrode of a third transistor may be connected to the first control line CS1, one electrode of the third transistor may be connected to a first sensing carry line CR(n−2), and the other electrode of the third transistor may be connected to the other electrode of a first capacitor C1. For example, a carry signal output from a first gate stage of any one of the previous stage groups may be applied to the first sensing carry line CR(n−2). In exemplary embodiments, the third transistor may include sub-transistors T3a and T3b connected in series. The gate electrode of the sub-transistor T3a may be connected to the first control line CS1, one electrode of the sub-transistor T3a may be connected to the first sensing carry line CR(n−2), and the other electrode of the sub-transistor T3a may be connected to one electrode of the sub-transistor T3b. The gate electrode of the sub-transistor T3b may be connected to the first control line CS1, the one electrode of the sub-transistor T3b may be connected to the other electrode of the sub-transistor T3a, and the other electrode of the sub-transistor T3b may be connected to the other electrode of the first capacitor C1.

The gate electrode of a fourth transistor T4 may be connected to the other electrode of the third transistor, one electrode of the fourth transistor T4 may be connected to the second control line CS2, and the other electrode of the fourth transistor T4 may be connected to the first node N1.

One electrode of the first capacitor C1 may be connected to the one electrode of the fourth transistor T4, and the other electrode of the first capacitor C1 may be connected to the gate electrode of the fourth transistor T4.

The gate electrode of a fifth transistor T5 may be connected to the third control line CS3, one electrode of the fifth transistor T5 may be connected to the first node N1, and the other electrode of the fifth transistor T5 may be connected to the first Q node Qn.

The gate electrode of a sixth transistor T6 may be connected to the first Q node Qn, one electrode of the sixth transistor T6 may be connected to the second control line CS2, and the other electrode of the sixth transistor T6 may be connected to the first node N1.

One electrode of a second capacitor C2 may be connected to the gate electrode of the first transistor T1, and the other electrode of the second capacitor C2 may be connected to the other electrode of the first transistor T1.

The seventh transistor T7 may include a first gate electrode and a second gate electrode, and the first and second gate electrodes may be synchronized with each other. The first and second gate electrodes of the seventh transistor T7 may be connected to the first Q node Qn, one electrode of the seventh transistor T7 may be connected to a first sensing clock line SSCK1, and the other electrode of the seventh transistor T7 may be connected to the first sensing line SSn.

One electrode of a third capacitor C3 may be connected to the gate electrode of the seventh transistor T7, and the other electrode of the third capacitor C3 may be connected to the other electrode of the seventh transistor T7.

The eighth transistor T8 may include a first gate electrode and a second gate electrode, and the first and second gate electrodes may be synchronized with each other. The first and second gate electrodes of the eighth transistor T8 may be connected to the first Q node Qn, one electrode of the eighth transistor T8 may be connected to a first carry clock line CRCK1, and the other electrode of the eighth transistor T8 may be connected to the first carry line CRn.

The gate electrode of a ninth transistor may be connected to a first reset carry line CR(n+4), one electrode of the ninth transistor may be connected to the first Q node Qn, and the other electrode of the ninth transistor may be connected to a first power line VSS1. For example, a carry signal output from a first gate stage of any one of next stage groups may be applied to the first reset carry line CR(n+4). In exemplary embodiments, the ninth transistor may include sub-transistors T9a and T9b connected in series. The gate electrode of the sub-transistor T9a may be connected to the first reset carry line CR(n+4), one electrode of the sub-transistor T9a may be connected to the first Q node Qn, and the other electrode of the sub-transistor T9a may be connected to the first node N1. The gate electrode of the sub-transistor T9b may be connected to the first reset carry line CR(n+4), one electrode of the sub-transistor T9b may be connected to the first node N1, and the other electrode of the sub-transistor T9b may be connected to the first power line VSS1.

The gate electrode of a tenth transistor may be connected to a first QB node QBn, one electrode of the tenth transistor may be connected to the first Q node Qn, and the other electrode of the tenth transistor may be connected to the first power line VSS1. In exemplary embodiments, the tenth transistor may include sub-transistors T10a and T10b connected in series. The gate electrode of the sub-transistor T10a may be connected to the first QB node QBn, one electrode of the sub-transistor T10a may be connected to the first Q node Qn, and the other electrode of the sub-transistor T10a may be connected to the first node N1. The gate electrode of the sub-transistor T10b may be connected to the first QB node QBn, one electrode of the sub-transistor T10b may be connected to the first node N1, and the other electrode of the sub-transistor T10b may be connected to the first power line VSS1.

The gate electrode of an eleventh transistor may be connected to a second QB node QB(n+1), one electrode of the eleventh transistor may be connected to the first Q node Qn, and the other electrode of the eleventh transistor may be connected to the first power line VSS1. In exemplary embodiments, the eleventh transistor may include sub-transistors T11a and T11b connected in series. The gate electrode of the sub-transistor T11a may be connected to the second QB node QB(n+1), one electrode of the sub-transistor T11a may be connected to the first Q node Qn, and the other electrode of the sub-transistor T11a may be connected to the first node N1. The gate electrode of the sub-transistor T11b may be connected to the second QB node QB(n+1), one electrode of the sub-transistor T11b may be connected to the first node N1, and the other electrode of the sub-transistor T11b may be connected to the first power line VSS1.

The gate electrode of a twelfth transistor T12 may be connected to the first QB node QBn, one electrode of the twelfth transistor T12 may be connected to the first carry line CRn, and the other electrode of the twelfth transistor T12 may be connected to the first power line VSS1.

The gate electrode of a thirteenth transistor T13 may be connected to the second QB node QB(n+1), one electrode of the thirteenth transistor T13 may be connected to the first carry line CRn, and the other electrode of the thirteenth transistor T13 may be connected to the first power line VSS1.

The gate electrode of a fourteenth transistor T14 may be connected to the first QB node QBn, one electrode of the fourteenth transistor T14 may be connected to the first sensing line SSn, and the other electrode of the fourteenth transistor T14 may be connected to a second power line VSS2.

The gate electrode of a fifteenth transistor T15 may be connected to the second QB node QB(n+1), one electrode of the fifteenth transistor T15 may be connected to the first sensing line SSn, and the other electrode of the fifteenth transistor T15 may be connected to the second power line VSS2.

The gate electrode of a sixteenth transistor T16 may be connected to the first QB node QBn, one electrode of the sixteenth transistor T16 may be connected to the first scan line SCn, and the other electrode of the sixteenth transistor T16 may be connected to the second power line VSS2.

The gate electrode of a seventeenth transistor T17 may be connected to the second QB node QB(n+1), one electrode of the seventeenth transistor T17 may be connected to the first scan line SCn, and the other electrode of the seventeenth transistor T17 may be connected to the second power line VSS2.

The gate electrode of an eighteenth transistor may be connected to the fourth control line CS4, one electrode of the eighteenth transistor may be connected to the first Q node Qn, and the other electrode of the eighteenth transistor may be connected to the first power line VSS1. In exemplary embodiments, the eighteenth transistor may include sub-transistors T18a and T18b connected in series. The gate electrode of the sub-transistor T18a may be connected to the fourth control line CS4, one electrode of the sub-transistor T18a may be connected to the first Q node Qn, and the other electrode of the sub-transistor T18a may be connected to the first node N1. The gate electrode of the sub-transistor T18b may be connected to the fourth control line CS4, one electrode of the sub-transistor T18b may be connected to the first node N1, and the other electrode of the sub-transistor T18b may be connected to the first power line VSS1.

The gate electrode of a nineteenth transistor T19 may be connected to the first Q node Qn, one electrode of the nineteenth transistor T19 may be connected to the first power line VSS1, and the other electrode of the nineteenth transistor T19 may be connected to the first QB node QBn.

The gate electrode of a twentieth transistor T20 may be connected to the first scan carry line CR(n−3), one electrode of the twentieth transistor T20 may be connected to the first power line VSS1, and the other electrode of the twentieth transistor T20 may be connected to the first QB node QBn.

The gate electrode of a twenty-first transistor T21 may be connected to the other electrode of the third transistor, one electrode of the twenty-first transistor T21 may be connected to the first power line VSS1, and the other electrode of the twenty-first transistor T21 may be connected to one electrode of a twenty-second transistor T22.

The gate electrode of the twenty-second transistor T22 may be connected to the third control line CS3, the one electrode of the twenty-second transistor T22 may be connected to the other electrode of the twenty-first transistor T21, and the other electrode of the twenty-second transistor T22 may be connected to the first QB node QBn.

The gate electrode and one electrode of a twenty-third transistor T23 may be connected to the fifth control line CS5, and the other electrode of the twenty-third transistor T23 may be connected to a gate electrode of a twenty-fourth transistor T24.

The gate electrode of the twenty-fourth transistor T24 may be connected to the other electrode of the twenty-third transistor T23, one electrode of the twenty-fourth transistor T24 may be connected to the fifth control line CS5, and the other electrode of the twenty-fourth transistor T24 may be connected to the first QB node QBn.

The gate electrode of a twenty-fifth transistor T25 may be connected to the first Q node Qn, one electrode of the twenty-fifth transistor T25 may be connected to the gate electrode of the twenty-fourth transistor T24, and the other electrode of the twenty-fifth transistor T25 may be connected to a third power line VSS3.

The gate electrode of a twenty-sixth transistor T26 may be connected to a second Q node Q(n+1), one electrode of the twenty-sixth transistor T26 may be connected to the gate electrode of the twenty-fourth transistor T24, and the other electrode of the twenty-sixth transistor T26 may be connected to the third power line VSS3.

The gate electrode of a twenty-seventh transistor T27 may be connected to the other electrode of the sub-transistor T3b, one electrode of the twenty-seventh transistor T27 may be connected to the one electrode of the sub-transistor T3b, and the other electrode of the twenty-seventh transistor T27 may be connected to the second control line CS2.

Next, the second gate stage ST(n+1) may include transistors T28 to T54 and capacitors C4 to C6.

The gate electrode of a twenty-eighth transistor T28 may be connected to the second Q node Q(n+1), one electrode of the twenty-eighth transistor T28 may be connected to the second scan line SC(n+1), and the other electrode of the twenty-eighth transistor T28 may be connected to a second scan clock line SCCK2. In exemplary embodiments, the twenty-eighth transistor T28 may include two gate electrodes connected to the second Q node Q(n+1) and synchronized with each other, such as the first transistor T1.

The fourth capacitor C4 may connect the gate electrode and the one electrode of the twenty-eighth transistor T28.

The gate electrode of a twenty-ninth transistor T29 may be connected to the second Q node Q(n+1), one electrode of the twenty-ninth transistor T29 may be connected to the second sensing line SS(n+1), and the other electrode of the twenty-ninth transistor T29 may be connected to the second sensing clock line SSCK2. In exemplary embodiments, the twenty-ninth transistor T29 may include two gate electrodes synchronized with each other, such as the seventh transistor T7.

The fifth capacitor Cs may connect the gate electrode and the one electrode of the twenty-ninth transistor T29.

The gate electrode of a thirtieth transistor T30 may be connected to the second Q node Q(n+1), one electrode of the thirtieth transistor T30 may be connected to the second carry line CR(n+1), and the other electrode of the thirtieth transistor T30 may be connected to a second carry clock line CRCK2. In exemplary embodiments, the thirtieth transistor T30 may include two gate electrodes synchronized with each other, such as the eighth transistor T8.

The gate electrode of a thirty-first transistor may be connected to the first QB node QBn, one electrode of the thirty-first transistor may be connected to the first power line VSS1, and the other electrode of the thirty-first transistor may be connected to the second Q node Q(n+1). In exemplary embodiments, the thirty-first transistor may include sub-transistors T31a and T31b connected in series. The gate electrode of the sub-transistor T31a may be connected to the first QB node QBn, one electrode of the sub-transistor T31a may be connected to the first power line VSS1, and the other electrode of the sub-transistor T31a may be connected to a second node N2. The gate electrode of the sub-transistor T31b may be connected to the first QB node QBn, one electrode of the sub-transistor T31b may be connected to the second node N2, and the other electrode of the sub-transistor T31b may be connected to the second Q node Q(n+1).

The gate electrode of a thirty-second transistor may be connected to the second QB node QB(n+1), one electrode of the thirty-second transistor may be connected to the first power line VSS1, and the other electrode of the thirty-second transistor may be connected to the second Q node Q(n+1). In exemplary embodiments, the thirty-second transistor may include sub-transistors T32a and T32b connected in series. The gate electrode of the sub-transistor T32a may be connected to the second QB node QB(n+1), one electrode of the sub-transistor T32a may be connected to the first power line VSS, and the other electrode of the sub-transistor T32a may be connected to the second node N2. The gate electrode of the sub-transistor T32b may be connected to the second QB node (n+1), one electrode of the sub-transistor T32b may be connected to the second node N2, and the other electrode of the sub-transistor T32b may be connected to the second Q node Q(n+1).

The gate electrode of a thirty-third transistor T33 may be connected to the sixth control line CS6, one electrode of the thirty-third transistor T33 may be connected to a gate electrode of a thirty-fourth transistor T34, and the other electrode of the thirty-third transistor T33 may be connected to the sixth control line CS6.

The gate electrode of the thirty-fourth transistor T34 may be connected to the one electrode of the thirty-third transistor T33, one electrode of the thirty-fourth transistor T34 may be connected to the second QB node QB(n+1), and the other electrode of the thirty-fourth transistor T34 may be connected to the sixth control line CS6.

The gate electrode of a thirty-fifth transistor T35 may be connected to the first Q node Qn, one electrode of the thirty-fifth transistor T35 may be connected to the third power line VSS3, and the other electrode of the thirty-fifth transistor T35 may be connected to the gate electrode of the thirty-fourth transistor T34.

The gate electrode of a thirty-sixth transistor T36 may be connected to the second Q node Q(n+1), one electrode of the thirty-sixth transistor T36 may be connected to the third power line VSS3, and the other electrode of the thirty-sixth transistor T36 may be connected to the gate electrode of the thirty-fourth transistor T34.

The gate electrode of a thirty-seventh transistor T37 may be connected to the first QB node QBn, one electrode of the thirty-seventh transistor T37 may be connected to the first power line VSS1, and the other electrode of the thirty-seventh transistor T37 may be connected to the second carry line CR(n+1).

The gate electrode of a thirty-eighth transistor T38 may be connected to the second QB node QB(n+1), one electrode of the thirty-eighth transistor T38 may be connected to the first power line VSS1, and the other electrode of the thirty-eighth transistor T38 may be connected to the second carry line CR(n+1).

The gate electrode of a thirty-ninth transistor T39 may be connected to the first QB node QBn, one electrode of the thirty-ninth transistor T39 may be connected to the second power line VSS2, and the other electrode of the thirty-ninth transistor T39 may be connected to the second sensing line SS(n+1).

The gate electrode of a fortieth transistor T40 may be connected to the second QB node QB(n+1), one electrode of the fortieth transistor T40 may be connected to the second power line VSS2, and the other electrode of the fortieth transistor T40 may be connected to the second sensing line SS(n+1).

The gate electrode of a forty-first transistor T41 may be connected to the first QB node QBn, one electrode of the forty-first transistor T41 may be connected to the second power line VSS2, and the other electrode of the forty-first transistor T41 may be connected to the second scan line SC(n+1).

The gate electrode of a forty-second transistor T42 may be connected to the second QB node QB(n+1), one electrode of the forty-second transistor T42 may be connected to the second power line VSS2, and the other electrode of the forty-second transistor T42 may be connected to the second scan line SC(n+1).

The gate electrode of a forty-third transistor may be connected to a first control line CS1, one electrode of the forty-third transistor may be connected to a second sensing carry line CR(n−1), and the other electrode of the forty-third transistor may be connected to a gate electrode of a forty-fifth transistor T45. For example, a carry signal output from a second gate stage of any one of the previous stage groups may be applied to the second sensing carry line CR(n−1). In exemplary embodiments, the forty-third transistor may include sub-transistors T43a and T43b connected in series. The gate electrode of the sub-transistor T43a may be connected to the first control line CS1, one electrode of the sub-transistor T43a may be connected to the second sensing carry line CR(n−1), and the other electrode of the sub-transistor T43a may be connected to one electrode of the sub-transistor T43b. The gate electrode of the sub-transistor T43b may be connected to the first carry line CS1, the one electrode of the sub-transistor T43b may be connected to the other electrode of the sub-transistor T43a, and the other electrode of the sub-transistor T43b may be connected to the gate electrode of the forty-fifth transistor T45.

The gate electrode of a forty-fourth transistor T44 may be connected to the third control line CS3, one electrode of the forty-fourth transistor T44 may be connected to the second Q node Q(n+1), and the other electrode of the forty-fourth transistor T44 may be connected to the second node N2.

The gate electrode of the forty-fifth transistor T45 may be connected to the other electrode of the forty-third transistor, one electrode of the forty-fifth transistor T45 may be connected to the second node N2, and the other electrode of the forty-fifth transistor T45 may be connected to the second control line CS2.

One electrode of a sixth capacitor C6 may be connected to the gate electrode of the forty-fifth transistor T45, and the other electrode of the sixth transistor C6 may be connected to the other electrode of the forty-fifth transistor T45.

One electrode of a forty-sixth transistor may be connected to the second Q node Q(n+1), and a gate electrode and the other electrode of the forty-sixth transistor may be connected to a second scan carry line CR(n−1). For example, a carry signal output from a second gate stage of any one of the previous stage groups may be applied to the second scan carry line CR(n−1). In exemplary embodiments, the forty-sixth transistor may include sub-transistors T46a and T46b connected in series. The gate electrode of the sub-transistor T46a may be connected to the second scan carry line CR(n−1), one electrode of the sub-transistor T46a may be connected to the second Q node Q(n+1), and the other electrode of the sub-transistor T46a may be connected to the second node N2. The gate electrode of the sub-transistor T46b may be connected to the second scan carry line CR(n−1), one electrode of the sub-transistor T46b may be connected to the second node N2, and the other electrode of the sub-transistor T46b may be connected to the second scan carry line CR(n−1).

The gate electrode of a forty-seventh transistor T47 may be connected to the second Q node Q(n+1), one electrode of the forty-seventh transistor T47 may be connected to the second control line CS2, and the other electrode of the forty-seventh transistor T47 may be connected to the second node N2.

The gate electrode of a forty-eighth transistor T48 may be connected to the other electrode of the forty-third transistor, one electrode of the forty-eighth transistor T48 may be connected to the first power line VSS1, and the other electrode of the forty-eight transistor T48 may be connected to one electrode of a forty-ninth transistor T49.

The gate electrode of the forty-ninth transistor T49 may be connected to the third control line CS3, the one electrode of the forty-ninth transistor T49, and the other electrode of the forty-ninth transistor T49 may be connected to the second QB node QB(n+1).

The gate electrode of a fiftieth transistor T50 may be connected to the second Q node Q(n+1), one electrode of the fiftieth transistor T50 may be connected to the second QB node QB(n+1), and the other electrode of the fiftieth transistor T50 may be connected to the first power line VSS1.

The gate electrode of a fifty-first transistor T51 may be connected to a first scan carry line CR(n−1), one electrode of the fifty-first transistor T51 may be connected to the second QB node QB(n+1), and the other electrode of the fifty-first transistor T51 may be connected to the first power line VSS1.

The gate electrode of a fifty-second transistor may be connected to the fourth control line CS4, one electrode of the fifty-second transistor may be connected to the first power line VSS1, and the other electrode of the fifty-second transistor may be connected to the second Q node Q(n+1). In exemplary embodiments, the fifty-second transistor may include sub-transistors T52a and T52b connected in series. The gate electrode of the sub-transistor T52a may be connected to the fourth control line CS4, one electrode of the sub-transistor T52a may be connected to the first power line VSS1, and the other electrode of the sub-transistor T52a may be connected to the second node N2. The gate electrode of the sub-transistor T52b may be connected to the fourth control line CS4, one electrode of the sub-transistor T52b may be connected to the second node N2, and the other electrode of the sub-transistor T52b may be connected to the second Q node Q(n+1).

The gate electrode of a fifty-third transistor may be connected to the first reset carry line CR(n+4), one electrode of the fifty-third transistor may be connected to the first power line VSS1, and the other electrode of the fifty-third transistor may be connected to the second Q node Q(n+1). In exemplary embodiments, the fifty-third transistor may include sub-transistors T53a and T53b connected in series. The gate electrode of the sub-transistor T53a may be connected to the first reset carry line CR(n+4), one electrode of the sub-transistor T53a may be connected to the first power line VSS1, and the other electrode of the sub-transistor T53a may be connected to the second node N2. The gate electrode of the sub-transistor T53b may be connected to the first reset carry line CR(n+4), one electrode of the sub-transistor T53b may be connected to the second node N2, and the other electrode of the sub-transistor T53b may be connected to the second Q node Q(n+1).

The gate electrode of a fifty-fourth transistor T54 may be connected to the other electrode of the sub-transistor T43b, one electrode of the fifty-fourth transistor T54 may be connected to the second control line CS2, and the other electrode of the fifty-fourth transistor T45 may be connected to the one electrode of the sub-transistor T43b.

As described above, the one electrodes of the first transistor T1, the seventh transistor T7, and the eighth transistor T8 may be directly connected to the respective clock lines SCCK1, SSCK1, and CRCK1. Clock signals applied through the clock lines SCCK1, SSCK1, and CRCK1 may have a high voltage level of 36 V or higher, and degradation of the first transistor T1, the seventh transistor T7, and the eighth transistor T8 may occur.

When the first transistor T1, the seventh transistor T7, and the eighth transistor T8 may have a synchronous gate electrode structure as shown in FIGS. 5 and 10, an amount of current flowing through the thin film transistor can be constantly maintained without degradation even when a clock signal having a high voltage level is applied.

Further, a carrier mobility characteristic of the thin film transistor can be improved through the synchronous gate electrode structure. Accordingly, the size of the thin film transistor can be decreased, and a narrow bezel of the display device can be effectively and efficiently implemented.

Referring to FIG. 11, a gate stage STm may be any one stage among the stages included in the gate driver 200 shown in FIG. 3.

The gate stage STm may be connected to a clock line CK, a first power line VSS1, and a second power line VSS2.

The gate stage STm may be connected to a first carry line CR(m−1), a second carry line CRm, and a third carry line CR(m+1). For example, a carry signal output from a previous gate stage may be applied to the first carry line CR(m−1). The carry signal output from the current gate stage STm may be applied to the second carry line CRm. The carry signal output from a next gate stage may be applied to the third carry line CR(m+1).

The gate stage STm may include transistors M1 to M18 and a capacitor C1. Hereinafter, although a case where the transistors M1 to M18 are implemented with an N-type transistor (e.g., an NMOS transistor) is assumed and described, those skilled in the art may design the gate stage STm by replacing some or all of the transistors M1 to M18 with a P-type transistor (e.g., a PMOS transistor).

The first transistor M1 may include a first gate electrode and a second gate electrode, and the first and second gate electrodes may be synchronized with each other. The first and second gate electrodes of the first transistor M1 may be connected to a Q node Qm, one electrode of the first transistor M1 may be connected to an output line OUT, and the other electrode of the first transistor M1 may be connected to the clock line CK.

One electrode of the capacitor C1 may be connected to the Q node Qm, and the other electrode of the capacitor C1 may be connected to the output line OUT.

The second transistor M2 may include a first gate electrode and a second gate electrode, and the first and second gate electrodes may be synchronized with each other. The first and second gate electrodes of the second transistor M2 may be connected to the third carry line CR(m+1), one electrode of the second transistor M2 may be connected to the output line OUT, and the other electrode of the second transistor M2 may be connected to the first power line VSS1.

The gate electrode of a third transistor M3 may be connected to a QB node QBm, one electrode of the third transistor M3 may be connected to the output line OUT, and the other electrode of the third transistor M3 may be connected to the first power line VSS1.

The gate electrode and one electrode of a fourth transistor M4 may be connected to the first carry line CR(m−1), and the other electrode of the fourth transistor M4 may be connected to a first node ND1.

The gate electrode of a fifth transistor M5 may be connected to the other electrode of a twelfth transistor M12, one electrode of the fifth transistor M5 may be connected to the clock line CK, and the other electrode of the fifth transistor M5 may be connected to the QB node QBm.

The gate electrode of a sixth transistor M6 may be connected to the second carry line CRm, one electrode of the sixth transistor M6 may be connected to the QB node QBm, and the other electrode of the sixth transistor M6 may be connected to the second power line VS S2.

The gate electrode of a seventh transistor M7 may be connected to the third carry line CR(m+1), one electrode of the seventh transistor M7 may be connected to the Q node Qm, and the other electrode of the seventh transistor M7 may be connected to the first node ND1.

The gate electrode of an eighth transistor M8 may be connected to the third carry line CR(m+1), one electrode of the eighth transistor M8 may be connected to the first node ND1, and the other electrode of the eighth transistor M8 may be connected to the second power line VSS2.

The gate electrode of a ninth transistor M9 may be connected to the QB node QBm, one electrode of the ninth transistor M9 may be connected to the Q node Qm, and the other electrode of the ninth transistor M9 may be connected to the first node ND1.

The gate electrode of a tenth transistor M10 may be connected to the QB node QBm, one electrode of the tenth transistor M10 may be connected to the first node ND1, and the other electrode of the tenth transistor M10 may be connected to the second power line VSS2.

The gate electrode of an eleventh transistor M11 may be connected to the QB node QBm, one electrode of the eleventh transistor M11 may be connected to the second carry line CRm, and the other electrode of the eleventh transistor M11 may be connected to the second power line VSS2.

The gate electrode and one electrode of the twelfth transistor M12 may be connected to the clock line CK, and the other electrode of the twelfth transistor M12 may be connected to one electrode of a thirteenth transistor M13.

The gate electrode of the thirteenth transistor M13 may be connected to the second carry line CRm, the one electrode of the thirteenth transistor M13 may be connected to the gate electrode of the fifth transistor M5, and the other electrode of the thirteenth transistor M13 may be connected to the second power line VSS2.

The fourteenth transistor M14 may include a first gate electrode and a second gate electrode, and the first and second gate electrodes may be synchronized with each other. The first and second gate electrodes of the fourteenth transistor M14 may be connected to the Q node Qm, one electrode of the fourteenth transistor M14 may be connected to the clock line CK, and the other electrode of the fourteenth transistor M14 may be connected to the second carry line CRm.

The gate electrode of a fifteenth transistor M15 may be connected to the third carry line CR(m+1), one electrode of the fifteenth transistor M15 may be connected to the second carry line CRm, and the other electrode of the fifteenth transistor M15 may be connected to the second power line VSS2.

The gate electrode and one electrode of a sixteenth transistor M16 may be connected to the first node ND1, and the other electrode of the sixteenth transistor M16 may be connected to the Q node Qm.

The gate electrode of a seventeenth transistor M17 may be connected to the third carry line CR(m+1), one electrode of the seventeenth transistor M17 may be connected to the first node ND1, and the other electrode of the seventeenth transistor M17 may be connected to the second power line VSS2.

The gate electrode and one electrode of an eighteenth transistor M18 may be connected to the second carry line CRm, and the other electrode of the eighteenth transistor M18 may be connected to the first node ND1. The second carry line CRm connected to the other electrode of the fourteenth transistor M14 may be connected to the gate electrode and the one electrode of the eighteenth transistor M18, and a separate connection line may be formed. That is, the carry signal output from the current gate stage STm may be again applied to the current gate stage STm through a feedback structure.

When the first transistor M1, the second transistor M2, and the fourteenth transistor M14 may have a synchronous gate electrode structure as shown in FIGS. 5 and 11, the amount of current flowing through the thin film transistor can be substantially constantly maintained without degradation even when a clock signal having a high voltage level is applied.

Further, the carrier mobility characteristic of the thin film transistor can be improved through the synchronous gate electrode structure. Accordingly, the size of the thin film transistor can be decreased, and a narrow bezel of the display device can be effectively and efficiently implemented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A gate driver for a display device, the gate driver comprising:
   a clock signal line to transfer a clock signal; and
   a plurality of stages to sequentially output a gate signal based upon the clock signal in response to a carry signal,
   wherein the plurality of stages include a plurality of thin film transistors,
   wherein at least one of the plurality of thin film transistors includes a thin film transistor including an oxide semiconductor,
   wherein the at least one thin film transistor includes a first gate electrode and a second gate electrode disposed in different layers,
   wherein the oxide semiconductor is disposed between the first gate electrode and the second gate electrode,
   wherein the first gate electrode and the second gate electrode are connected to receive a common voltage signal,
   wherein the at least one thin film transistor comprises:
      a transistor input terminal connected to a first electrode to receive an input signal; and
      a transistor output terminal connected to a second electrode to output an output signal, and
   wherein the first electrode is any one of a source electrode and a drain electrode, and the second electrode is the other of the source electrode and the drain electrode.

2. The gate driver of claim 1, wherein the first gate electrode and the second gate electrode contact and are electrically connected to each other.

3. The gate driver of claim 1, wherein the clock signal includes a first clock signal and a second clock signal,
   wherein the first clock signal has a pulse waveform, and
   wherein the second clock signal is a signal obtained by shifting the first clock signal by a half period of the first clock signal.

4. The gate driver of claim 3, wherein the transistor input terminal is directly connected to the clock signal line, and receives any one of the first clock signal and the second clock signal from the clock signal line.

5. The gate driver of claim 1, wherein the input signal applied to the transistor input terminal has a voltage of about 36 V or higher, and the at least one thin film transistor has a current maintenance ratio of about 90% or more.

6. The gate driver of claim 1, wherein the transistor output terminal is directly connected to a gate line, and outputs the gate signal through the gate line.

7. The gate driver of claim 1, wherein the plurality of stages are sequentially connected to each other through carry signal lines, and the transistor input terminal is directly connected to one of the carry signal lines to receive the carry signal of a previous stage from the one of the carry signal lines.

8. A gate driver for a display device comprising:
   a clock signal line configured to transfer a clock signal; and
   a plurality of stages to sequentially output a gate signal based upon the clock signal in response to a carry signal,
   wherein the plurality of stages include a plurality of thin film transistors,
   wherein at least one of the plurality of thin film transistors comprises:
   a substrate;
   a first electrode layer disposed on the substrate;
   a buffer layer disposed over the first electrode layer;
   an active layer disposed on the buffer layer, the active layer including an oxide semiconductor;
   a second electrode layer disposed on the active layer;
   a first protective layer covering the active layer, the first protective layer including a first contact hole exposing a first region of the active layer and a second contact hole exposing a second region of the active layer;
   a third electrode layer disposed on the first protective layer, the third electrode layer being connected to the first region through the first contact hole; and
   a fourth electrode layer disposed on the first protective layer, the fourth electrode layer being connected to the second region through the second contact hole, and
   wherein the second electrode layer is directly connected to the first electrode layer through a third contact hole formed in the buffer layer.

9. The gate driver of claim 8, wherein the at least one thin film transistor comprises:
- a transistor input terminal connected to the third electrode layer to receive an input signal; and
- a transistor output terminal connected to the fourth electrode layer to output an output signal, and
- wherein the third electrode layer is any one of a source electrode and a drain electrode, and the fourth electrode layer is the other of the source electrode and the drain electrode.

10. The gate driver of claim 9, wherein the input signal applied to the transistor input terminal has a voltage of about 36 V or higher, and the at least one thin film transistor has a current maintenance ratio of about 90% or more.

11. The gate driver of claim 9, wherein the transistor input terminal is directly connected to the clock signal line to receive the clock signal from the clock signal line.

12. The gate driver of claim 10, wherein the plurality of stages are sequentially connected to each other through carry signal lines, and the transistor input terminal is directly connected to one of the carry signal lines to receive the carry signal of a previous stage from the one of the carry signal lines.

13. A display device comprising:
- a display panel having a display region and a peripheral region;
- a display disposed on the display panel in the display region, the display including a plurality of pixels respectively connected to gate lines and data lines;
- a gate driver disposed on the display panel in the peripheral region to supply a gate signal to the gate lines; and
- a data driver to supply a data signal to the data lines,
- wherein the gate driver includes:
  - a clock signal line to transfer a clock signal; and
  - a plurality of stages to sequentially output the gate signal, based on the clock signal,
- wherein a pth (p is a natural number of 2 or more) stage of the plurality of stages is configured to output the gate signal to one of the gate lines based on the clock signal in response to a (p−1)th carry signal of a (p−1)th stage of the plurality of stages,
- wherein the pth stage includes a thin film transistor comprising an oxide semiconductor,
- wherein the thin film transistor includes a first gate electrode and a second gate electrode disposed in different layers,
- wherein the oxide semiconductor is disposed between the first gate electrode and the second gate electrode,
- wherein the first gate electrode and the second gate electrode are connected to commonly receive a voltage signal,
- wherein the thin film transistor comprises a drain electrode and a source electrode, and
- wherein one of the drain electrode and the source electrode is electrically connected to the clock signal line to receive the clock signal, and the other one of the drain electrode and the source electrode is electrically connected to the one of the gate lines to output the gate signal in response to the voltage signal.

14. The display device of claim 13, wherein the gate signal includes a scan signal and a sensing signal, and each of the gate lines includes a scan line and a sensing line, and
- wherein the scan signal is supplied to the plurality of pixels through the scan lines of the gate lines, and the sensing signal is supplied to the plurality of pixels through the sensing lines of the gate lines.

15. The display device of claim 14, wherein each of the plurality of pixels comprises:
- a light emitting device;
- a driving transistor to determine a magnitude of current flowing through the light emitting device;
- a switching transistor connected to a gate electrode of the driving transistor; and
- a sensing transistor connected to an anode electrode of the light emitting device, and
- wherein one of the scan lines is connected to a gate electrode of the switching transistor, one of the sensing lines is connected to a gate electrode of the sensing transistor, and one of the data lines is connected to one electrode of the switching transistor.

16. The display device of claim 13, wherein each of the plurality of pixels includes a first display plate, a second display plate facing the first display plate, and a liquid crystal layer disposed between the first display plate and the second display plate,
- wherein the first display plate includes a pixel electrode and a switching element connected to the pixel electrode, one of the gate lines, and one of the data lines, and
- wherein the second display plate includes a common electrode.

17. The display device of claim 13, wherein the plurality of stages are sequentially connected to each other through carry signal lines,
- wherein the at least one thin film transistor comprises a drain electrode and a source electrode, and
- wherein one of the drain electrode and the source electrode is electrically connected to one of the carry signal lines to receive the (p−1)th carry signal, and the other one of the drain electrode and the source electrode is configured to output an output signal in response to the voltage signal.

* * * * *